(12) United States Patent
Wakimoto et al.

(10) Patent No.: US 12,159,600 B2
(45) Date of Patent: Dec. 3, 2024

(54) DISPLAY DEVICE

(71) Applicant: Semiconductor Energy Laboratory Co., Ltd., Atsugi (JP)

(72) Inventors: Kenichi Wakimoto, Atsugi (JP); Masahiko Hayakawa, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/378,757

(22) Filed: Oct. 11, 2023

(65) Prior Publication Data

US 2024/0112645 A1 Apr. 4, 2024

Related U.S. Application Data

(63) Continuation of application No. 17/956,079, filed on Sep. 29, 2022, now Pat. No. 11,790,866, which is a (Continued)

(30) Foreign Application Priority Data

Jan. 20, 2010 (JP) .................. 2010-010250

(51) Int. Cl.
  *G09G 5/00* (2006.01)
  *G09G 3/36* (2006.01)
  *H01L 27/12* (2006.01)

(52) U.S. Cl.
  CPC ......... *G09G 3/3648* (2013.01); *G09G 3/3611* (2013.01); *H01L 27/1225* (2013.01);
  (Continued)

(58) Field of Classification Search
  CPC ............... G09G 3/3648; G09G 3/3611; G09G 2300/0408; G09G 2330/022; G09G 2340/0435; G09G 2360/14; H01L 27/1225
  (Continued)

(56) References Cited

U.S. PATENT DOCUMENTS 5,463,420 A 10/1995 Yamada
5,598,565 A 1/1997 Reinhardt
(Continued)

FOREIGN PATENT DOCUMENTS

CN 001466120 A 1/2004
EP 1164570 A 12/2001
(Continued)

OTHER PUBLICATIONS

International Search Report (Application No. PCT/JP2010/073660) Dated Feb. 1, 2011.
(Continued)

*Primary Examiner* — Jennifer T Nguyen
(74) *Attorney, Agent, or Firm* — Eric J. Robinson; Robinson Intellectual Property Law Office, P.C.

(57) ABSTRACT

To reduce power consumption of a display device with the use of a simple structure and a simple operation. The display device includes an input device. Input of an image signal to a driver circuit is controlled in accordance with an image operation signal output from the input device. Specifically, input of image signals at the time when the input device is not operated is less frequent than that at the time when the input device is operated. Accordingly, display degradation (deterioration of display quality) caused when the display device is used can be prevented and power consumed when the display device is not used can be reduced.

7 Claims, 9 Drawing Sheets

Related U.S. Application Data continuation of application No. 17/388,247, filed on Jul. 29, 2021, now Pat. No. 11,462,186, which is a continuation of application No. 16/804,398, filed on Feb. 28, 2020, now Pat. No. 11,081,072, which is a continuation of application No. 16/143,962, filed on Sep. 27, 2018, now Pat. No. 10,580,373, which is a continuation of application No. 15/259,335, filed on Sep. 8, 2016, now Pat. No. 10,089,946, which is a continuation of application No. 14/527,081, filed on Oct. 29, 2014, now Pat. No. 9,443,482, which is a continuation of application No. 13/005,559, filed on Jan. 13, 2011, now Pat. No. 8,957,881.

(52) U.S. Cl.
CPC ............... *G09G 2300/0408* (2013.01); *G09G 2330/022* (2013.01); *G09G 2340/0435* (2013.01); *G09G 2360/14* (2013.01)

(58) Field of Classification Search
USPC .......................................................... 345/87
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,940,061 A | 8/1999 | Sato |
| 6,069,620 A | 5/2000 | Nakamura et al. |
| 6,294,274 B1 | 9/2001 | Kawazoe et al. |
| 6,387,737 B1 | 5/2002 | Yamazaki et al. |
| 6,563,174 B2 | 5/2003 | Kawasaki et al. |
| 6,727,522 B1 | 4/2004 | Kawasaki et al. |
| 6,747,288 B2 | 6/2004 | Yamazaki et al. |
| 6,940,143 B2 | 9/2005 | Hiroshima |
| 7,019,329 B2 | 3/2006 | Yamazaki et al. |
| 7,034,792 B2 | 4/2006 | Tamura |
| 7,049,190 B2 | 5/2006 | Takeda et al. |
| 7,050,032 B2 | 5/2006 | Tamura |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,286,108 B2 | 10/2007 | Tsuda et al. |
| 7,297,977 B2 | 11/2007 | Hoffman et al. |
| 7,321,353 B2 | 1/2008 | Tsuda et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,414,266 B2 | 8/2008 | Yamazaki et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,511,343 B2 | 3/2009 | Li et al. |
| 7,598,520 B2 | 10/2009 | Hirao et al. |
| 7,616,193 B2 | 11/2009 | Joung et al. |
| 7,652,294 B2 | 1/2010 | Yamazaki et al. |
| 7,674,650 B2 | 3/2010 | Akimoto et al. |
| 7,728,334 B2 | 6/2010 | Yamazaki et al. |
| 7,732,819 B2 | 6/2010 | Akimoto et al. |
| 7,817,117 B2 | 10/2010 | Kimura |
| 7,864,153 B2 | 1/2011 | Yun et al. |
| 7,872,722 B2 | 1/2011 | Kimura |
| 7,893,495 B2 | 2/2011 | Li et al. |
| 7,910,490 B2 | 3/2011 | Akimoto et al. |
| 7,924,276 B2 | 4/2011 | Tsuda et al. |
| 7,932,521 B2 | 4/2011 | Akimoto et al. |
| 7,977,169 B2 | 7/2011 | Hirao et al. |
| 7,982,216 B2 | 7/2011 | Imai |
| 7,982,696 B2 | 7/2011 | Kimura |
| 7,993,964 B2 | 8/2011 | Hirao et al. |
| 8,098,223 B2 | 1/2012 | Yun et al. |
| 8,130,354 B2 | 3/2012 | Kimura |
| 8,159,478 B2 | 4/2012 | Ozaki et al. |
| 8,164,547 B2 | 4/2012 | Kimura |
| 8,178,926 B2 | 5/2012 | Nakayama |
| 8,198,630 B2 | 6/2012 | Yamazaki et al. |
| 8,202,365 B2 | 6/2012 | Umeda et al. |
| 8,214,864 B2 | 7/2012 | Emoto et al. |
| 8,217,877 B2 | 7/2012 | Fukutome |
| 8,274,077 B2 | 9/2012 | Akimoto et al. |
| 8,319,214 B2 | 11/2012 | Imai |
| 8,319,905 B2 | 11/2012 | Yoon et al. |
| 8,390,578 B2 | 3/2013 | Chino |
| 8,466,463 B2 | 6/2013 | Akimoto et al. |
| 8,502,217 B2 | 8/2013 | Sato et al. |
| 8,586,988 B2 | 11/2013 | Yamazaki et al. |
| 8,599,115 B2 | 12/2013 | Kimura |
| 8,629,069 B2 | 1/2014 | Akimoto et al. |
| 8,669,550 B2 | 3/2014 | Akimoto et al. |
| 8,723,781 B2 | 5/2014 | Fukutome et al. |
| 8,780,307 B2 | 7/2014 | Kimura |
| 8,790,959 B2 | 7/2014 | Akimoto et al. |
| 8,796,069 B2 | 8/2014 | Akimoto et al. |
| 8,872,739 B2 | 10/2014 | Kimura |
| 8,957,881 B2 | 2/2015 | Wakimoto et al. |
| 8,964,156 B2 | 2/2015 | Kimura |
| 9,041,630 B2 | 5/2015 | Kimura |
| 9,059,045 B2 | 6/2015 | Yamazaki et al. |
| 9,099,562 B2 | 8/2015 | Akimoto et al. |
| 9,368,514 B2 | 6/2016 | Yamazaki et al. |
| 9,379,142 B2 | 6/2016 | Kimura |
| 9,443,482 B2 | 9/2016 | Wakimoto et al. |
| 9,569,996 B2 | 2/2017 | Kimura |
| 9,786,687 B2 | 10/2017 | Yamazaki et al. |
| 9,829,761 B2 | 11/2017 | Kimura |
| 10,089,946 B2 | 10/2018 | Wakimoto et al. |
| 10,304,962 B2 | 5/2019 | Akimoto et al. |
| 10,698,277 B2 | 6/2020 | Kimura |
| 11,016,354 B2 | 5/2021 | Kimura |
| 11,081,072 B2 | 8/2021 | Wakimoto et al. |
| 2001/0046027 A1 | 11/2001 | Tai et al. |
| 2002/0036636 A1 | 3/2002 | Yanagi et al. |
| 2002/0056838 A1 | 5/2002 | Ogawa |
| 2002/0132454 A1 | 9/2002 | Ohtsu et al. |
| 2003/0025685 A1 | 2/2003 | Shirasaki et al. |
| 2003/0112257 A1 | 6/2003 | Tamura |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0063476 A1 | 4/2004 | Katagishi et al. |
| 2004/0127038 A1 | 7/2004 | Carcia et al. |
| 2005/0017302 A1 | 1/2005 | Hoffman |
| 2005/0156838 A1 | 7/2005 | Miyagawa et al. |
| 2005/0168415 A1 | 8/2005 | Noda et al. |
| 2005/0199959 A1 | 9/2005 | Chiang et al. |
| 2005/0285868 A1 | 12/2005 | Obinata |
| 2006/0012592 A1 | 1/2006 | Sato et al. |
| 2006/0034042 A1 | 2/2006 | Hisano et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0134891 A1 | 6/2006 | Ohnuma et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |

(56) References Cited

U.S. PATENT DOCUMENTS

| | | |
|---|---|---|
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0105288 A1 | 5/2007 | Miyairi et al. |
| 2007/0108446 A1* | 5/2007 | Akimoto ............ H01L 29/45 257/E29.147 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0200818 A1 | 8/2007 | Miyamoto et al. |
| 2007/0252928 A1 | 11/2007 | Ito et al. |
| 2007/0272922 A1* | 11/2007 | Kim ............... H01L 29/4908 257/43 |
| 2007/0279574 A1 | 12/2007 | Minamizaki et al. |
| 2007/0287296 A1 | 12/2007 | Chang |
| 2008/0006877 A1 | 1/2008 | Mardilovich et al. |
| 2008/0023698 A1 | 1/2008 | Li et al. |
| 2008/0038882 A1 | 2/2008 | Takechi et al. |
| 2008/0038929 A1 | 2/2008 | Chang |
| 2008/0045023 A1 | 2/2008 | Kanemoto |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0143728 A1 | 6/2008 | Gorla et al. |
| 2008/0166834 A1 | 7/2008 | Kim et al. |
| 2008/0180451 A1 | 7/2008 | Obinata |
| 2008/0182358 A1 | 7/2008 | Cowdery-Corvan et al. |
| 2008/0191204 A1* | 8/2008 | Kim ............... H01L 29/7869 257/E29.094 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1* | 10/2008 | Kim ............... H01L 29/78618 257/E29.147 |
| 2008/0296568 A1 | 12/2008 | Ryu et al. |
| 2008/0308797 A1 | 12/2008 | Akimoto et al. |
| 2008/0308805 A1 | 12/2008 | Akimoto et al. |
| 2009/0001881 A1 | 1/2009 | Nakayama |
| 2009/0068773 A1 | 3/2009 | Lai et al. |
| 2009/0073325 A1 | 3/2009 | Kuwabara et al. |
| 2009/0078940 A1 | 3/2009 | Afentakis et al. |
| 2009/0106849 A1 | 4/2009 | Wu |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0207154 A1 | 8/2009 | Chino |
| 2009/0278122 A1 | 11/2009 | Hosono et al. |
| 2009/0280600 A1 | 11/2009 | Hosono et al. |
| 2009/0295428 A1 | 12/2009 | Hibino et al. |
| 2009/0302316 A1 | 12/2009 | Lee et al. |
| 2009/0303163 A1 | 12/2009 | Kohno et al. |
| 2009/0321731 A1 | 12/2009 | Jeong et al. |
| 2010/0026169 A1 | 2/2010 | Jeong et al. |
| 2010/0051940 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0123654 A1 | 5/2010 | Kimura |
| 2010/0134473 A1 | 6/2010 | Matsuda et al. |
| 2010/0148168 A1 | 6/2010 | Lai et al. |
| 2010/0148170 A1 | 6/2010 | Ueda et al. |
| 2010/0176383 A1 | 7/2010 | Park et al. |
| 2010/0193772 A1 | 8/2010 | Morosawa et al. |
| 2010/0298032 A1 | 11/2010 | Lee et al. |
| 2011/0095288 A1 | 4/2011 | Morosawa et al. |
| 2011/0104851 A1 | 5/2011 | Akimoto et al. |
| 2011/0121290 A1 | 5/2011 | Akimoto et al. |
| 2019/0051759 A1 | 2/2019 | Akimoto et al. |
| 2019/0326444 A1 | 10/2019 | Akimoto et al. |
| 2021/0271144 A1 | 9/2021 | Kimura |
| 2022/0069137 A1 | 3/2022 | Akimoto et al. |

FOREIGN PATENT DOCUMENTS

| | | |
|---|---|---|
| EP | 1164571 A | 12/2001 |
| EP | 1296174 A | 3/2003 |
| EP | 1737044 A | 12/2006 |
| EP | 1770788 A | 4/2007 |
| EP | 1903800 A | 3/2008 |
| EP | 1921681 A | 5/2008 |
| EP | 1976018 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2061086 A | 5/2009 |
| EP | 2061087 A | 5/2009 |
| EP | 2226847 A | 9/2010 |
| EP | 3614442 A | 2/2020 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-026832 A | 1/1997 |
| JP | 09-185037 A | 7/1997 |
| JP | 11-003063 A | 1/1999 |
| JP | 11-505377 | 5/1999 |
| JP | 11-202841 A | 7/1999 |
| JP | 11-202842 A | 7/1999 |
| JP | 2000-044236 A | 2/2000 |
| JP | 2000-150900 A | 5/2000 |
| JP | 2001-222249 A | 8/2001 |
| JP | 2001-312253 A | 11/2001 |
| JP | 2002-076356 A | 3/2002 |
| JP | 2002-140052 A | 5/2002 |
| JP | 2002-238894 A | 8/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-151222 A | 5/2004 |
| JP | 2004-273614 A | 9/2004 |
| JP | 2004-273732 A | 9/2004 |
| JP | 2005-181917 A | 7/2005 |
| JP | 2005-210707 A | 8/2005 |
| JP | 2005-292707 A | 10/2005 |
| JP | 2006-011074 A | 1/2006 |
| JP | 2006-030566 A | 2/2006 |
| JP | 2007-096055 A | 4/2007 |
| JP | 2007-123861 A | 5/2007 |
| JP | 2007-220820 A | 8/2007 |
| JP | 2007-225873 A | 9/2007 |
| JP | 2007-272179 A | 10/2007 |
| JP | 2007-298973 A | 11/2007 |
| JP | 2008-009383 A | 1/2008 |
| JP | 2008-065225 A | 3/2008 |
| JP | 2008-098637 A | 4/2008 |
| JP | 2008-533693 | 8/2008 |
| JP | 2008-233925 A | 10/2008 |
| JP | 2009-031750 A | 2/2009 |
| JP | 2009-116324 A | 5/2009 |
| JP | 2009-141002 A | 6/2009 |
| JP | 2009-141342 A | 6/2009 |
| JP | 2009-167087 A | 7/2009 |
| JP | 2009-193482 A | 8/2009 |

(56) References Cited

FOREIGN PATENT DOCUMENTS

| | | |
|---|---|---|
| JP | 2009-528670 | 8/2009 |
| JP | 2009-212476 A | 9/2009 |
| JP | 2010-085683 A | 4/2010 |
| JP | 5027313 | 9/2012 |
| KR | 2001-0089222 A | 9/2001 |
| KR | 2008-0039313 A | 5/2008 |
| KR | 2008-0066678 A | 7/2008 |
| KR | 2008-0087744 A | 10/2008 |
| KR | 2009-0050970 A | 5/2009 |
| KR | 2009-0078568 A | 7/2009 |
| KR | 2009-0089254 A | 8/2009 |
| KR | 2009-0128139 A | 12/2009 |
| TW | 200947406 | 11/2009 |
| WO | WO-2003/056541 | 7/2003 |
| WO | WO-2004/114391 | 12/2004 |
| WO | WO-2007/007494 | 1/2007 |
| WO | WO-2007/094501 | 8/2007 |
| WO | WO-2007/142167 | 12/2007 |
| WO | WO-2009/034953 | 3/2009 |
| WO | WO-2009/051050 | 4/2009 |
| WO | WO-2009/063797 | 5/2009 |
| WO | WO-2009/072532 | 6/2009 |
| WO | WO-2011/089833 | 7/2011 |

OTHER PUBLICATIONS

Written Opinion (Application No. PCT/JP2010/073660) Dated Feb. 1, 2011.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IgZo Transparent Amorphous Oxide Semiconductor", IDW '08 : Proceedings of The 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) Sep. 13, 2004, vol. 85, No. 11, pp. 1993-1995.
Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by The Threshold Voltage Controlled Amorphous GiZo ($Ga_2O_3$—$In_2O_3$—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of The 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa. Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2: Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In—Ga—Zn-Oxide TFTs", IDW '09 : Proceedings of The 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of The Society for Information Display), 2007, vol. 15, No. 1, pp. 17-22.

Hosono.H, "68.3:Invited Paper: Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for The Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of The 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel, $YbFe_2O_4$, and $Yb_2Fe_3O_7$ Types of Structures for Compounds in the $In_2O_3$ and $Sc_2O_3$—$A_2O_3$—Bo Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of The Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent $InGaZnO4$", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of The 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Chinese Office Action (Application No. 201080062018.4) dated Sep. 10, 2014.

Taiwanese Office Action (Application No. 100100334) dated Apr. 17, 2015.

Taiwanese Office Action (Application No. 104128392) dated Jul. 6, 2016.

Taiwanese Office Action (Application No. 105137898) dated Jan. 11, 2017.

Korean Office Action (Application No. 2017-7006325) dated Jun. 9, 2017.

Korean Office Action (Application No. 2018-7026029) dated Nov. 15, 2018.

\* cited by examiner

DISPLAY DEVICE

TECHNICAL FIELD

The present invention relates to a display device. In particular, the present invention relates to a display device in which input of image signals to a pixel portion can be controlled.

BACKGROUND ART

Active matrix display devices have been in widespread use. The display device includes a pixel portion and a driver circuit which controls image display in the pixel portion. Specifically, in the display device, display is performed in such a manner that image signals input to a plurality of pixels arranged in matrix in the pixel portion are controlled by the driver circuit.

In recent years, concern for the global environment has been increased and development of low-power-consumption display devices has been attracting attention.

For example, a technique by which power consumption of a liquid crystal display device is reduced is disclosed in Patent Document 1. Specifically, a liquid crystal display device is disclosed in which all data signal lines are electrically separated from a data signal driver to be in a high-impedance state (also referred to as an indefinite state and a floating state) during an idle period in which all scan lines and data signal lines are in a non-selected state.

[Patent Document 1] Japanese Published Patent Application No. 2001-312253

Disclosure of Invention

However, in order to achieve a liquid crystal display device disclosed in Patent Document 1, the structure and operation of a driver circuit included in the liquid crystal display device need to be complicated.

In view of the above, an object of one embodiment of the present invention is to reduce power consumption of a display device with the use of a simple structure and a simple operation.

The above object can be achieved in such a manner that an input device is provided in a display device and input of an image signal to a driver circuit is controlled in accordance with an image operation signal output from the input device.

One embodiment of the present invention is a display device in which input of image signals to a pixel portion is controlled by a driver circuit to perform image display. The display device includes an input device which outputs an image operation signal; a signal detection circuit which detects the image operation signal and outputs a detection signal; a signal generation circuit which generates a reference image signal; a signal extraction circuit to which the reference image signal is input and which outputs an extracted image signal which is formed by extracting part of the reference image signal; and a first relay circuit and a second relay circuit to each of which the detection signal is input. In the display device, the reference image signal which is input through the first relay circuit when the image operation signal is detected by the signal detection circuit is selected as the image signal, and the extracted image signal which is input through the second relay circuit when the image operation signal is not detected by the signal detection circuit is selected as the image signal.

In the display device of one embodiment of the present invention, an image signal output from a driver circuit can be selected in accordance with the operation of an input device. Specifically, input of image signals at the time when the input device is not operated is less frequent than that at the time when the input device is operated. Accordingly, display degradation (deterioration of display quality) caused when the display device is used can be prevented and power consumed when the display device is not used can be reduced.

BEST MODE FOR CARRYING OUT THE INVENTION

Hereinafter, embodiments of the present invention will be described in detail with reference to the accompanying drawings. Note that the present invention is not limited to the description below and it is easily understood by those skilled in the art that a variety of changes and modifications can be made without departing from the spirit and scope of the present invention. Therefore, the present invention should not be construed as being limited to the description of the embodiments given below.

Embodiment 1

In this embodiment, a display device that is one embodiment of the present invention will be described. Specifically, a display device in which input of image signals to a pixel portion is controlled by a driver circuit to perform image display will be described with reference to FIG. 1, FIGS. 2A and 2B, FIGS. 3A and 3B, FIGS. 4A to 4F, and FIGS. 5A and 5B.

Figure 1:
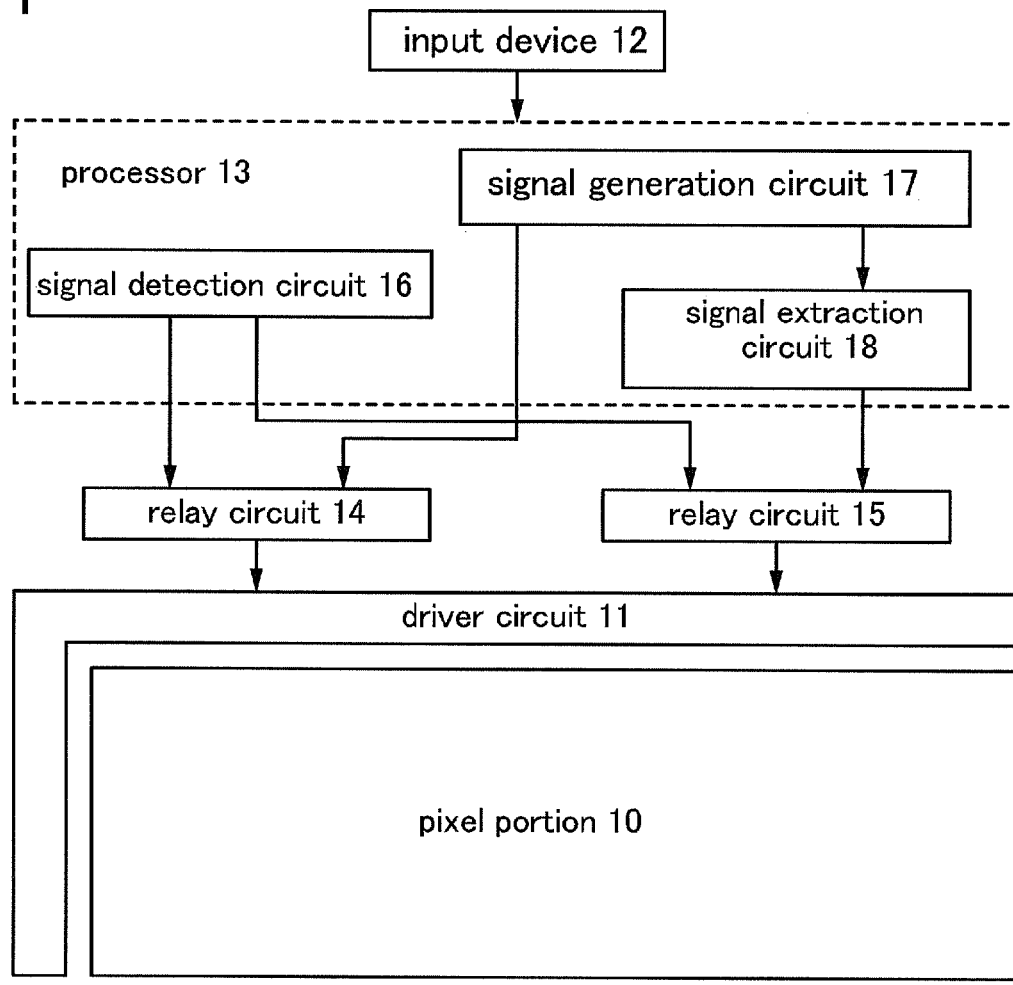
FIG. 1 is a diagram illustrating a display device according to Embodiment 1.

FIG. 1 is a block diagram illustrating a structure of a display device in this embodiment. The display device illustrated in FIG. 1 includes a pixel portion 10; a driver circuit 11 which controls input of image signals to the pixel portion 10; an input device 12 which outputs an image operation signal; a processor 13 to which the image operation signal is input; and a relay circuit (also referred to as a switch circuit) 14 and a relay circuit (also referred to as a switch circuit) 15 which control input of a variety of signals, which are output from the processor 13, to the driver circuit 11. Note that the image operation signal is a signal which is output when the input device 12 is operated by a user and which controls display in the pixel portion 10. Specific examples of the input device 12 include a keyboard, a mouse, a touchpad, and the like.

The processor 13 includes a signal detection circuit 16 which detects an image operation signal output from the input device 12 and outputs a detection signal; a signal generation circuit 17 which generates a reference image signal on the basis of the image operation signal or the like; and a signal extraction circuit 18 to which the reference image signal is input and which outputs an extracted image signal. Note that the detection signal is a binary signal (a signal indicating that an image operation signal is "input" or "not input" to the processor 13). Note also that the reference image signal is an image signal which has a specific frame frequency and the extracted image signal is an image signal which is formed by extracting part of the reference image signal. For example, an image signal with a frame frequency (also referred to as a refresh rate) of 60 Hz (i.e., a frame rate of 60 fps) can be used as the reference image signal, and an image signal with a frame frequency (also referred to as a refresh rate) of 1 Hz (i.e., a frame rate of 1 fps) can be used as the extracted image signal. Note that a period of the reference image signal of one frame and that of the extracted image signal of one frame are the same. In other words, the extracted image signal is not a signal of the reference image of one frame, which shows an image of one frame for one second but a signal which is identical to a signal of 1/60 seconds of the reference image signal. In addition, the extracted image signal has a period in which the extracted image signal is identical to the reference image signal and a period in which there is no signal.

The relay circuit 14 is a circuit which controls input of a reference image signal to the driver circuit 11. The relay circuit 15 is a circuit which controls input of an extracted image signal to the driver circuit 11. In addition, the operations of the relay circuit 14 and the relay circuit 15 are controlled by a detection signal. Specifically, a reference image signal is input to the driver circuit 11 through the relay circuit 14 when an image operation signal is detected by the signal detection circuit 16; an extracted image signal is input to the driver circuit 11 through the relay circuit 15 when the image operation signal is not detected. In other words, a signal to be input to the driver circuit 11 is selected by a detection signal.

The operation of the display device illustrated in FIG. 1 will be described with reference to flowcharts of FIGS. 2A and 2B. Note that the operation illustrated in the flowchart of FIG. 2A and that illustrated in the flowchart of FIG. 2B are performed in parallel with each other in the display device illustrated in FIG. 1.

Figure 2A:
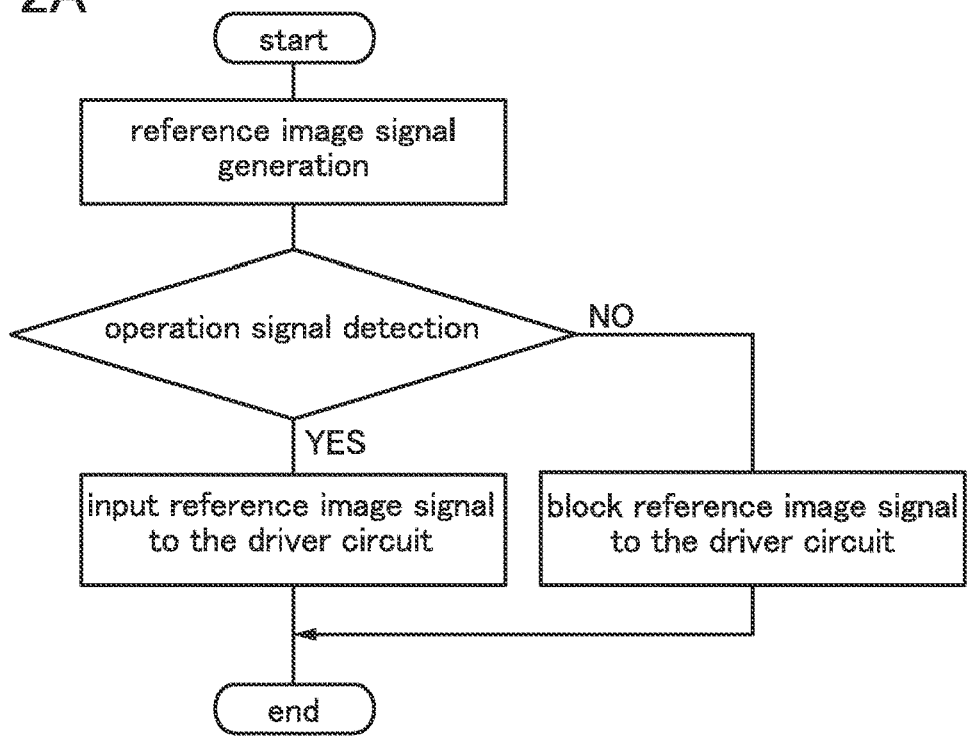
FIGS. 2A and 2B are flowcharts each illustrating a display device according to Embodiment 1.

As illustrated in FIG. 2A, in the display device illustrated in FIG. 1, a reference image signal is first generated by the signal generation circuit 17. Then, the reference image signal is input to the driver circuit 11 when an image operation signal input from the input device 12 is detected by the signal detection circuit 16, whereas input of the reference image signal to the driver circuit 11 is blocked by the relay circuit 14 when the image operation signal is not detected by the signal detection circuit 16.

Figure 2B:
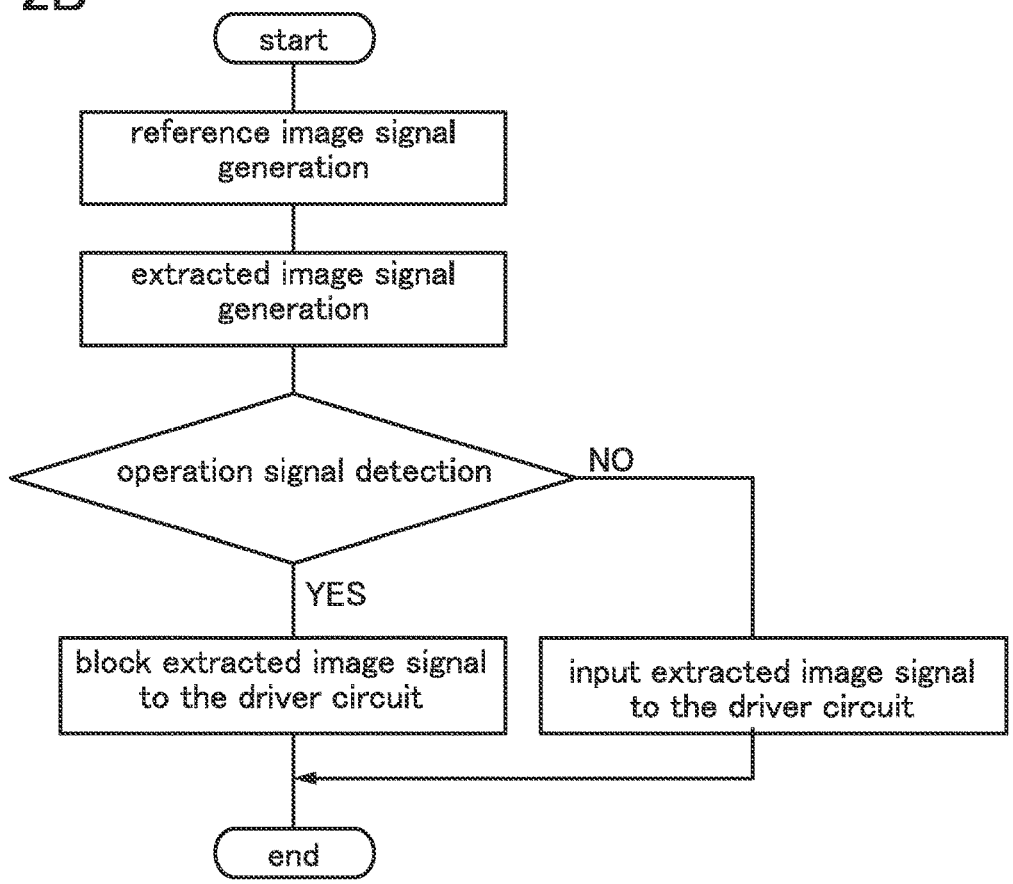

Further, as illustrated in FIG. 2B, in the display device illustrated in FIG. 1, a reference image signal is first generated by the signal generation circuit 17. Then, an extracted image signal is generated by the signal extraction circuit 18 on the basis of the reference image signal. Then, input of the extracted image signal to the driver circuit 11 is blocked by the relay circuit 15 when an image operation signal is detected by the signal detection circuit 16, whereas an extracted image signal is input to the driver circuit 11 when the image operation signal is not detected by the signal detection circuit 16.

These operations are performed in parallel with each other in the display device illustrated in FIG. 1, whereby image signals input to the driver circuit 11 can be correlated with the operation of the input device 12 (detection of an image operation signal). Specifically, when the input device 12 is operated by a user, display can be performed by inputting reference image signals to the pixel portion 10, whereas when the input device 12 is not operated by a user, display can be performed by inputting extracted image signals to the pixel portion 10. Accordingly, display degradation (deterioration of display quality) caused when the display device is used can be prevented and power consumed when the display device is not used can be reduced.

Figure 3A:
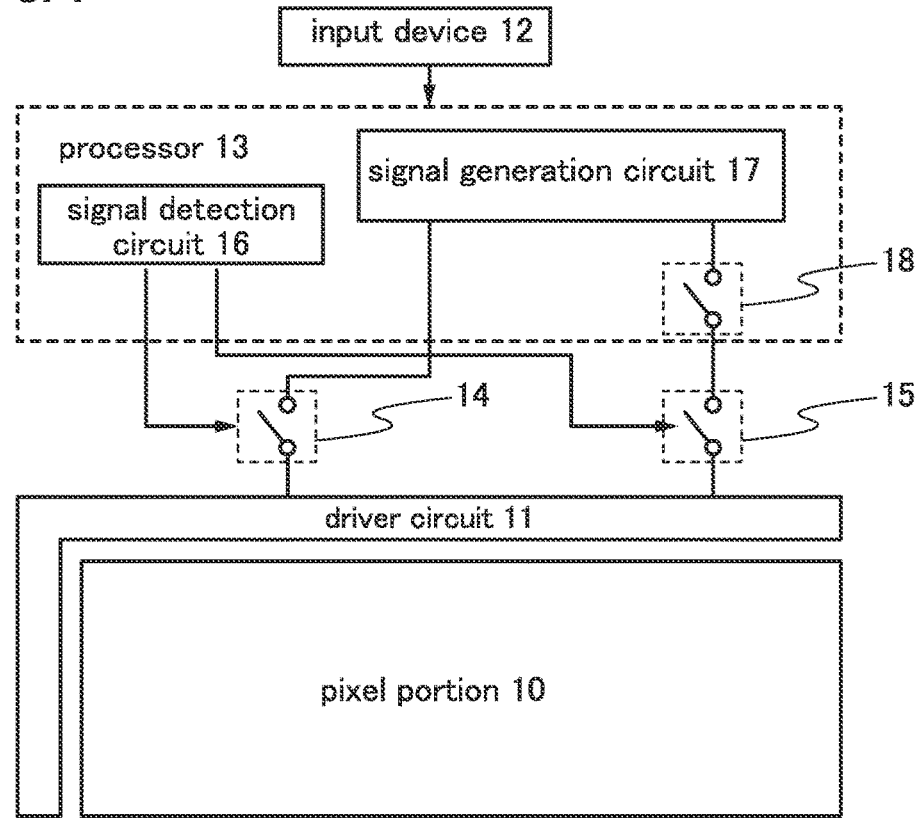
FIGS. 3A and 3B are diagrams each illustrating a display device according to Embodiment 1.

Note that as illustrated in FIG. 3A, circuits having functions as switches can be used as the relay circuit 14, the relay circuit 15, and the signal extraction circuit 18 which are included in the display device illustrated in FIG. 1. In that case, the switching operations of the relay circuit 14 and the relay circuit 15 are each controlled in accordance with a detection signal output from the signal detection circuit 16. In contrast, the signal extraction circuit 18 does not depend on a detection signal but the switching operation thereof is controlled periodically. Note that the switch can control electrical connection. Specific examples of the switch include a transistor, a micro electro mechanical system (MEMS) switch, and the like.

Figure 3B:
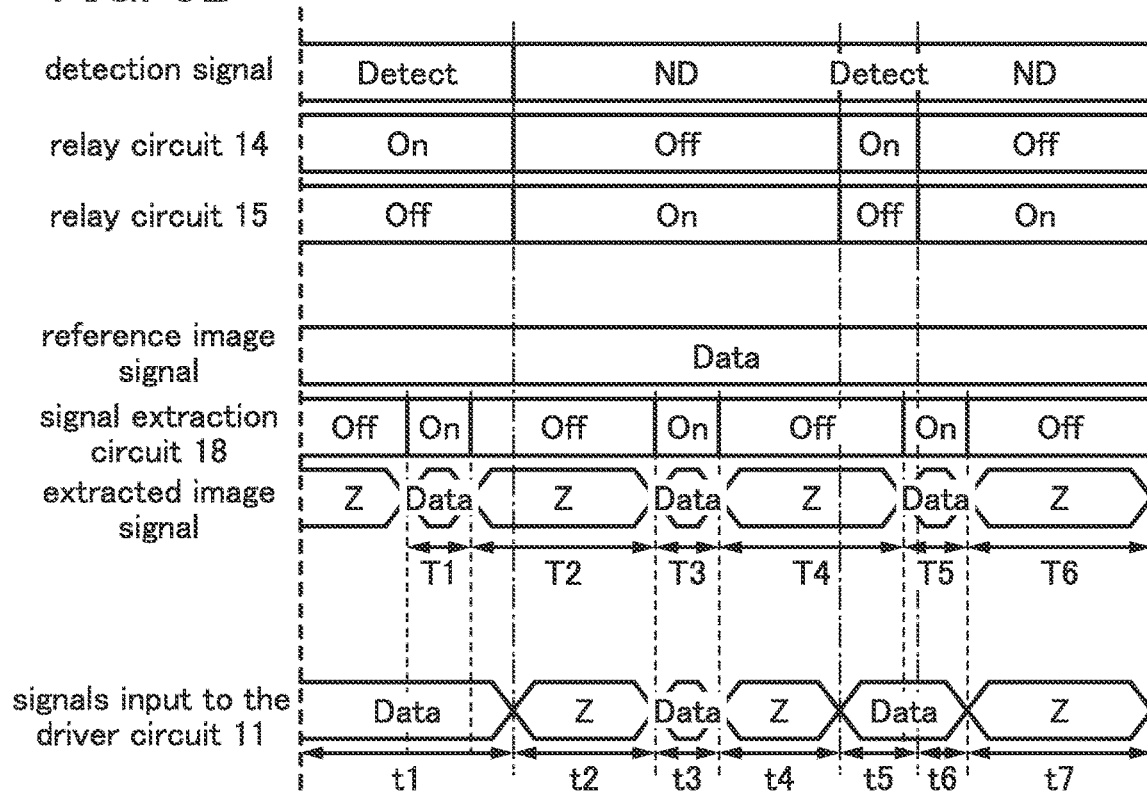

FIG. 3B illustrates a specific example of the operation of each of the relay circuit 14, the relay circuit 15, and the signal extraction circuit 18 in the case where these circuits are regarded as switches. As described above, a detection signal output from the signal detection circuit 16 is generated by an operation by a user. Thus, in the detection signal, a state in which an image operation signal is detected (Detect) and a state in which an image operation signal is not detected (Not Detected; ND) are irregularly changed. The relay circuit 14 and the relay circuit 15 function as switches which perform the switching operations in accordance with the change of the detection signal. Specifically, the relay circuit 14 functions as a switch which is turned on (On) in a period (Detect) in which an image operation signal is detected and is turned off (Off) in a period (Not Detected; ND) in which an image operation signal is not detected. In contrast, the relay circuit 15 functions as a switch which is turned off (Off) in the period (Detect) in which the image operation signal is detected and is turned on (On) in the period (Not Detected; ND) in which the image operation signal is not detected.

Further, as described above, an extracted image signal output from the signal extraction circuit 18 is a signal which is formed by extracting part of a reference image signal. Thus, the extracted image signal can be generated by selectively outputting a reference image signal input to the signal extraction circuit 18. In other words, when the signal extraction circuit 18 functions as a switch which performs a switching operation as appropriate, the extracted image signal can be generated. FIG. 3B illustrates an example in which the signal extraction circuit 18 functions as a switch which is turned on (On) periodically (in Period T1, Period T3, and Period T5). Needless to say, a reference image signal and an extracted image signal are identical image signals in Period T1, Period T3, and Period T5. Note that the lengths of Period T1, Period T3, and Period T5 in FIG. 3B are the same. In a period (Period T2, Period T4, and Period T6) in which the signal extraction circuit 18 is in an off state (Off), an extracted image signal is in a high-impedance state (Z).

Further, in FIG. 3B, signals input to the driver circuit 11 at the time when the relay circuit 14, the relay circuit 15, and the signal extraction circuit 18 operate as illustrated in FIG.

3B are also illustrated. The signal input to the driver circuit 11 in each period will be described in detail below.

In Period t1, an image signal is input to the driver circuit 11. The image signal in Period t1 is a reference image signal which is input through the relay circuit 14. The input of the reference image signal to the driver circuit 11 results from detection of an image operation signal by the signal detection circuit 16.

In Period t2, an image signal is not input to the driver circuit 11. This results from the fact that an image operation signal is not detected by the signal detection circuit 16 in Period t2 and the fact that the signal extraction circuit 18 functions as a switch which is turned off (Off) in Period t2. Note that an image signal is not input to the driver circuit 11 only in the case of the above-described states.

In Period t3, an image signal is input to the driver circuit 11. The image signal in Period t3 is an extracted image signal input through the relay circuit 15. The input of the extracted image signal to the driver circuit 11 results from the fact that an image operation signal is not detected by the signal detection circuit 16 and the fact that the signal extraction circuit 18 functions as a switch which is turned on (On) in Period t3.

In Period t4, an image signal is not input to the driver circuit 11 (refer to the description of Period t2).

In Period t5, an image signal is input to the driver circuit 11 (refer to the description of Period t1).

In Period t6, an image signal is input to the driver circuit 11 (refer to the description of Period t3).

In Period t7, an image signal is not input to the driver circuit 11 (refer to the description of Period t2).

In the display device illustrated in FIGS. 3A and 3B, the signal detection circuit 16 which detects an image operation signal output from the input device 12 and outputs a binary signal; two switches (the relay circuit 14 and the relay circuit 15) the switching operations of which are controlled by the signals output from the signal detection circuit 16; and a switch (the signal extraction circuit 18) the switching operation of which is set in advance allow a reduction in power consumption. Thus, the display device illustrated in FIGS. 3A and 3B is a display device the power consumption of which can be reduced with a simple structure and a simple operation.

Although the structure in which a signal input to the driver circuit 11 is changed at the same time as the change of a detection signal is described with reference to FIG. 3B, a structure may be employed in which a holding period is provided between the change of a detection signal and the change of a signal input to the driver circuit 11. Accordingly, deterioration of display quality can be prevented. The reason will be described below.

As described above, an image signal has a specific frame frequency. For example, in the case of an image signal with a frame frequency of 60 Hz, one image is formed, in the pixel portion 10, using an image signal of 1/60 seconds (about 0.0167 seconds). In contrast, a detection signal is not synchronized with the frame frequency. For that reason, input of the image signal is blocked during the formation of one image if the structure is employed in which the signal input to the driver circuit 11 is changed at the same time as the change of the detection signal. As a result, display quality of the display device might be deteriorated. Specifically, this problem might occur at the boundary between Period t1 and Period t2, or the like in the operations illustrated in FIG. 3B.

Figure 4A:
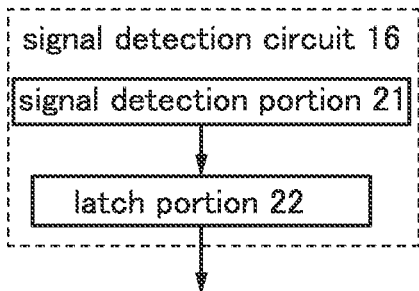
FIGS. 4A to 4F are diagrams each illustrating a display device according to Embodiment 1.

For example, when a structure is employed in which, as illustrated in FIG. 4A, the signal detection circuit 16 periodically detects an image operation signal and includes a signal detection portion 21 which outputs a detection signal and a latch portion 22 to which the detection signal is input, the holding period can be provided. Note that the latch portion 22 is a circuit which can control an output signal on the basis of signals which are discontinuously input and can continuously output the output signals (hold the output signal). In addition, in the signal detection circuit 16 illustrated in FIG. 4A, the signal output to the latch portion 22 is a detection signal.

Figure 4B:
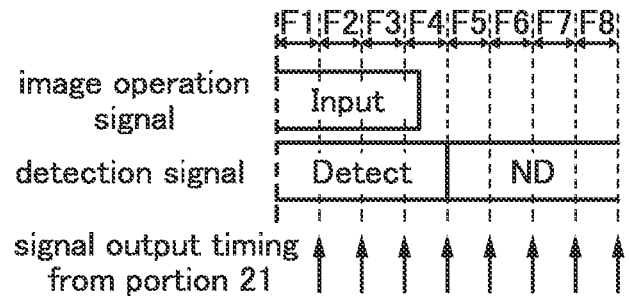

The operation of the signal detection circuit 16 illustrated in FIG. 4A will be described with reference to FIG. 4B. In the signal detection circuit 16 illustrated in FIG. 4A, at the timing when each of Frame Period F1 to Frame Period F8 starts, an image operation signal is detected and the detection result is output to the latch portion 22. Accordingly, even in the case where input of the image operation signal stops during the frame period (during Frame Period F4 in FIG. 4B), the timing at which the detection signal is changed can be the same as the timing at which another frame period starts.

Figure 4C:
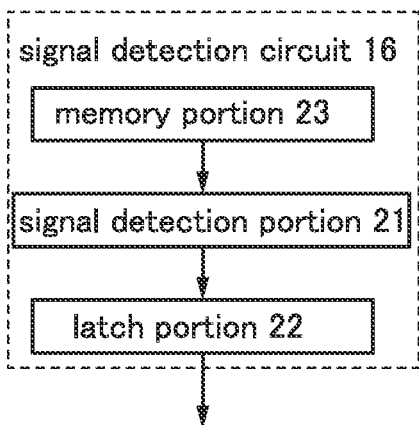
Figure 4D:
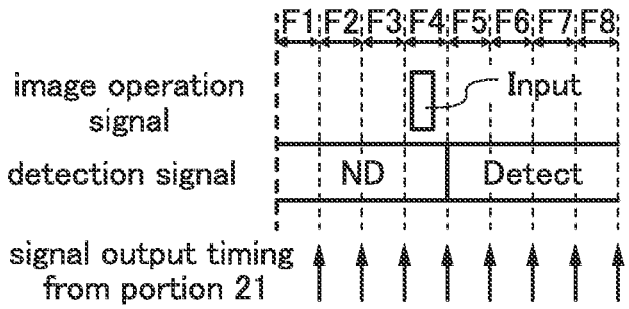
Figure 4E:
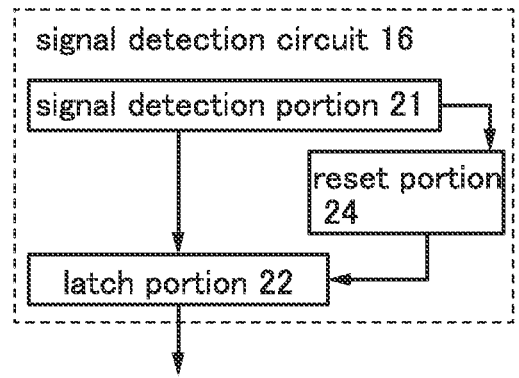
Figure 4F:
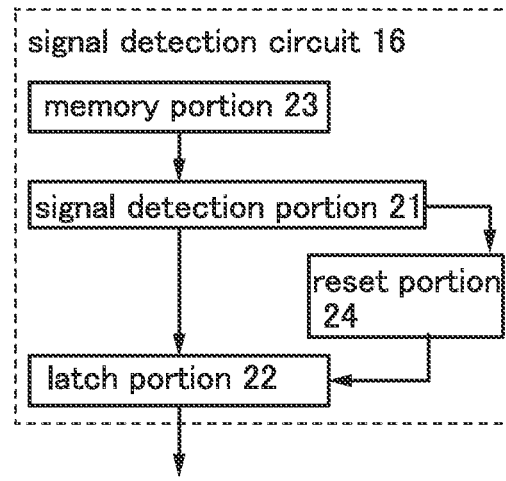

Further, even in the case where an input period of an image operation signal is shorter than a frame period, when the signal detection circuit 16 includes, as illustrated in FIG. 4C, a memory portion 23, the signal detection portion 21 which detects an image operation signal from the memory portion 23 and outputs a detection signal, and the latch portion 22 to which a signal output from the signal detection portion 21 is input, an image signal input to the driver circuit 11 can be controlled without missing the input of the image operation signal. Note that the memory portion 23 can store an image operation signal in a specific period. FIG. 4D illustrates a specific example of the above-described case.

In each of the structures illustrated in FIGS. 4A and 4C, a reset portion 24 may be provided in which a signal output to the latch portion 22 is reset after the signal output to the latch portion 22 is held for a certain period (a detection signal is changed in a state in which an image operation signal is not detected (Not Detected; ND) (see FIGS. 4E and 4F).

Moreover, it is preferable that an extracted image signal be generated by the signal extraction circuit 18 in consideration of the frame frequency of a reference image signal so that the above-described problem (i.e., a defect that input of an image signal is blocked during the formation of one image) is not caused. For example, it is preferable that the signal extraction circuit 18 serve as a circuit which functions as a switch which is turned on at the same time as the start of a frame period and keeps the on state for a period which is as long as the frame period or a period which is an integral multiple of the frame period.

Figure 5A:
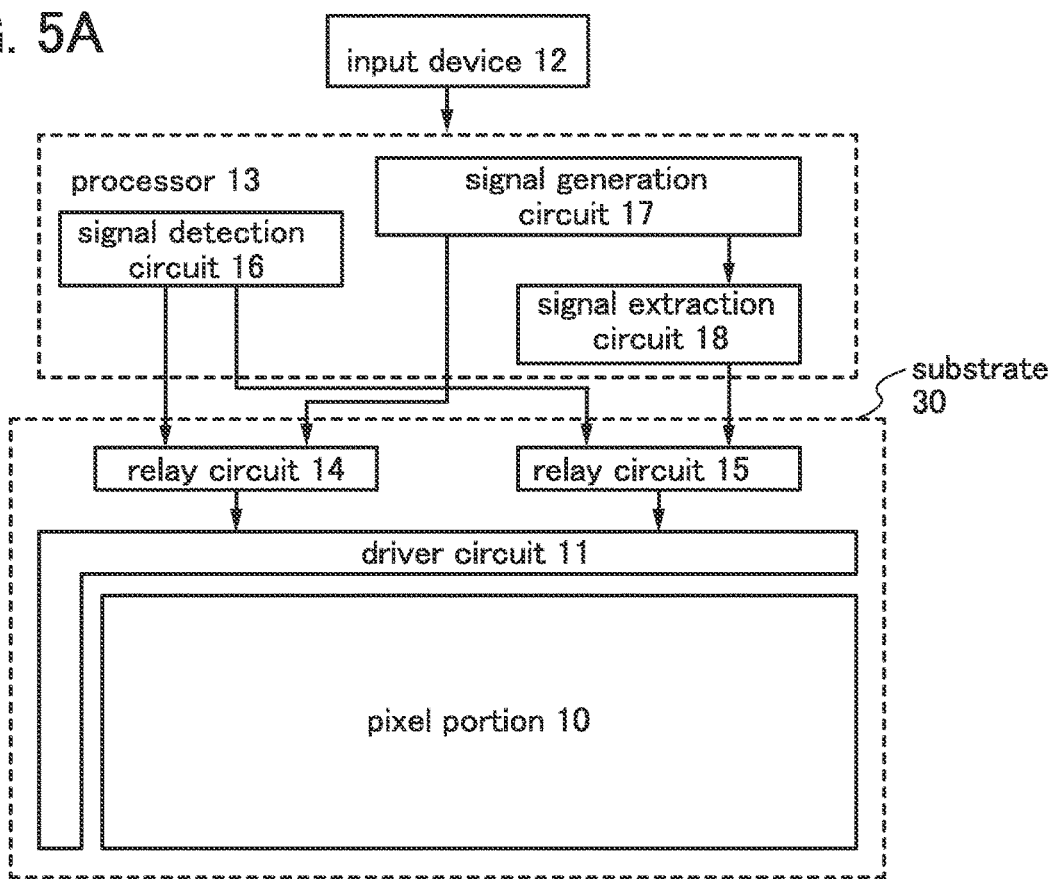
FIGS. 5A and 5B are diagrams each illustrating a display device according to Embodiment 1.
Figure 5B:
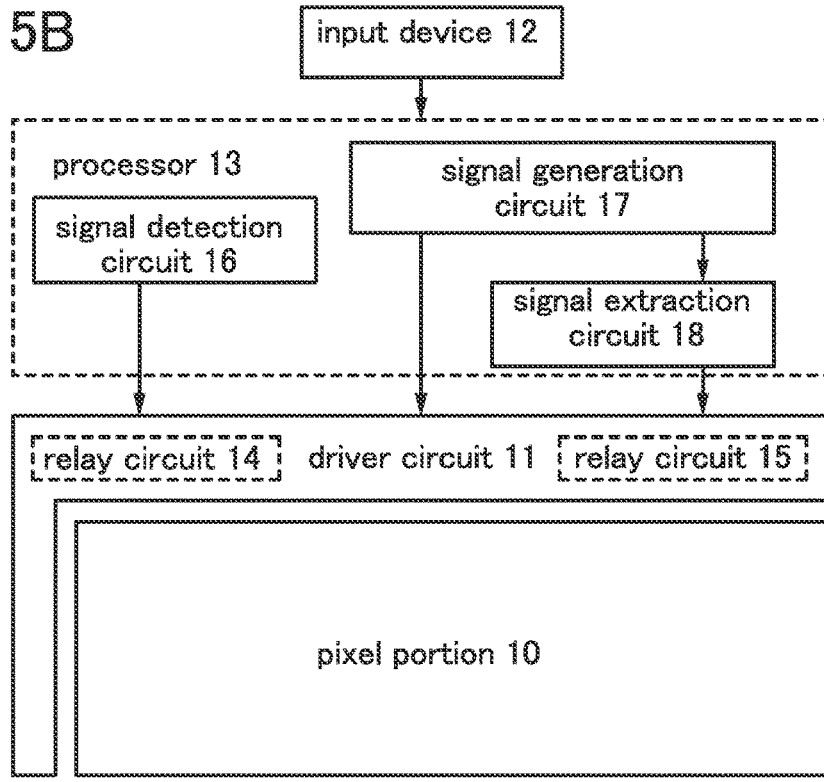

Note that as illustrated in FIG. 5A, the pixel portion 10, the driver circuit 11, the relay circuit 14, and the relay circuit 15 can be formed over one substrate 30. Alternatively, the pixel portion 10, part of the driver circuit 11, the relay circuit 14, and the relay circuit 15 can be formed over one substrate. As illustrated in FIG. 5B, a structure in which the driver circuit 11 includes the relay circuit 14 and the relay circuit may be employed. Note that in the structure illustrated in FIG. 5B, the pixel portion and the driver circuit 11 can be formed over one substrate. Alternatively, the pixel portion 10 and part of the driver circuit 11 can be formed over one substrate.

Although the structure of the above display device in which only input of an image signal is controlled is described, a structure can be employed in which input of a variety of control signals for controlling the driver circuit 11 (e.g., start pulse (SP), clock (CK), power supply potential (Vdd), and power supply potential ($V_{SS}$)) to the driver circuit 11 is also performed by the relay circuit 14 and the relay circuit 15.

Note that this embodiment or part of this embodiment can be freely combined with the other embodiments or part of the other embodiments.

Embodiment 2

In this embodiment, the structure of the display device described in Embodiment 1 will be described in detail. Specifically, an example of a transistor included in the display device will be described with reference to FIGS. 6A to 6D. Note that the transistor described in this embodiment is preferable as a transistor for controlling input of an image signal, which is provided in each pixel in the display device described in Embodiment 1.

Figure 6A:
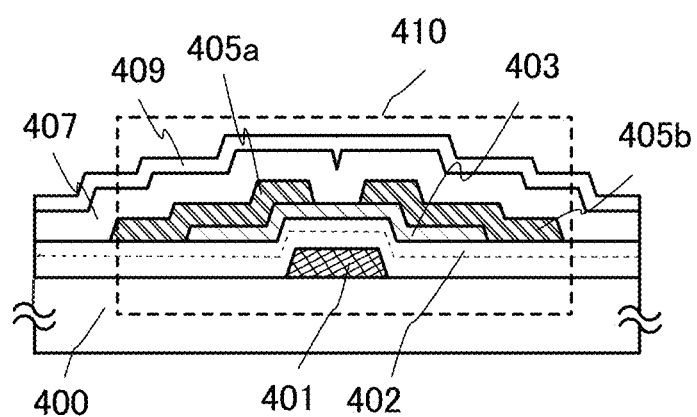
FIGS. 6A to 6D are views each illustrating a transistor according to Embodiment 2.

A transistor 410 illustrated in FIG. 6A is one of bottom-gate transistors and is also called an inverted staggered transistor.

The transistor 410 includes, over a substrate 400 having an insulating surface, a gate electrode layer 401, a gate insulating layer 402, an oxide semiconductor layer 403, a source electrode layer 405a, and a drain electrode layer 405b. Further, an insulating layer 407 stacked over the oxide semiconductor layer 403 is provided so as to cover the transistor 410. Further, a protective insulating layer 409 is formed over the insulating layer 407.

Figure 6B:
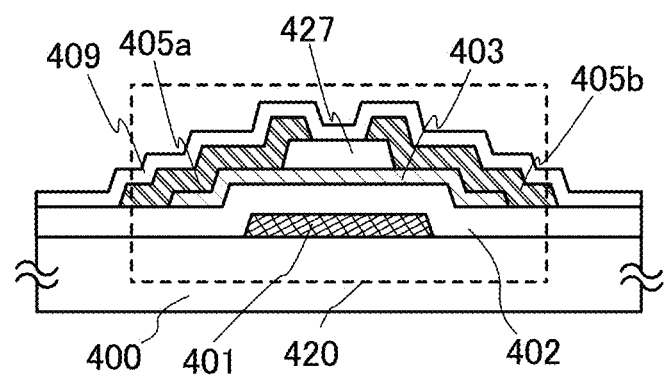

A transistor 420 illustrated in FIG. 6B is one of bottom-gate transistors called channel-protective (channel-stop) transistors and is also called an inverted staggered transistor.

The transistor 420 includes, over the substrate 400 having an insulating surface, the gate electrode layer 401, the gate insulating layer 402, the oxide semiconductor layer 403, an insulating layer 427 which functions as a channel protective layer for covering a channel formation region of the oxide semiconductor layer 403, the source electrode layer 405a, and the drain electrode layer 405b. Further, the protective insulating layer 409 is formed so as to cover the transistor 420.

Figure 6C:
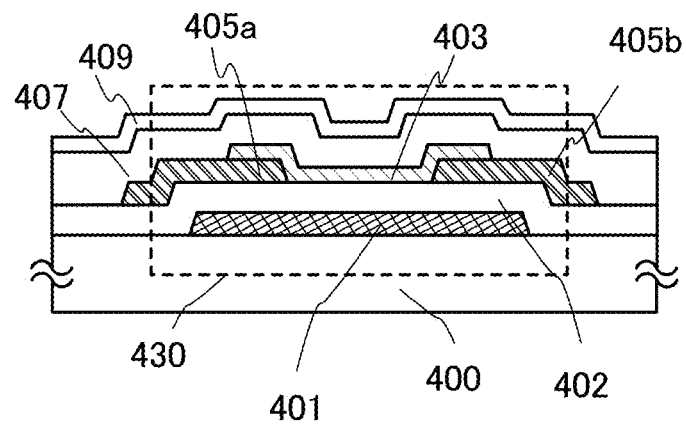

A transistor 430 illustrated in FIG. 6C is a bottom-gate transistor. The transistor 430 includes, over the substrate 400 having an insulating surface, the gate electrode layer 401, the gate insulating layer 402, the source electrode layer 405a, the drain electrode layer 405b, and the oxide semiconductor layer 403. Further, the insulating layer 407 which is in contact with the oxide semiconductor layer 403 and covers the transistor 430 is provided. Further, the protective insulating layer 409 is formed over the insulating layer 407.

In the transistor 430, the gate insulating layer 402 is provided on and in contact with the substrate 400 and the gate electrode layer 401; the source electrode layer 405a and the drain electrode layer 405b are provided on and in contact with the gate insulating layer 402. Further, the oxide semiconductor layer 403 is provided over the gate insulating layer 402, the source electrode layer 405a, and the drain electrode layer 405b.

Figure 6D:
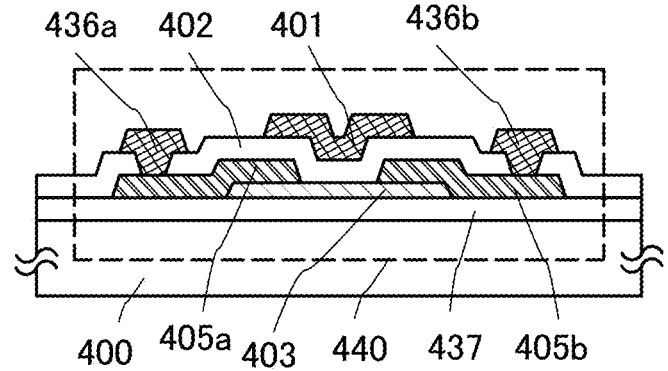

A transistor 440 illustrated in FIG. 6D is one of top-gate transistors. The transistor 440 includes, over the substrate 400 having an insulating surface, an insulating layer 437, the oxide semiconductor layer 403, the source electrode layer 405a, the drain electrode layer 405b, the gate insulating layer 402, and the gate electrode layer 401. A wiring layer 436a and a wiring layer 436b are provided in contact with and electrically connected to the source electrode layer 405a and the drain electrode layer 405b, respectively.

In this embodiment, as described above, the oxide semiconductor layer 403 is used as a semiconductor layer. As an oxide semiconductor used for the oxide semiconductor layer 403, the following can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, an In—Ga—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor; a single-component metal oxide such as an In—O-based oxide semiconductor, a Sn—O-based oxide semiconductor, or a Zn—O-based oxide semiconductor. Further, $SiO_2$ may be contained in the above oxide semiconductor. Here, for example, the In—Ga—Zn—O-based oxide semiconductor means an oxide containing at least In, Ga, and Zn, and the composition ratio of the elements is not particularly limited. Further, an element other than In, Ga, and Zn may be contained.

As the oxide semiconductor layer 403, a thin film of a material represented by $In/MO_3 (ZnO)_m (m>0)$ can be used. Here, M represents one or more metal elements selected from Ga, Al, Mn, and Co. For example, M can be Ga, Ga and Al, Ga and Mn, Ga and Co, and the like.

Although there is no particular limitation on a substrate that can be used as the substrate 400 having an insulating surface, a glass substrate made of barium borosilicate glass, aluminoborosilicate glass, or the like can be used.

In the bottom-gate transistors 410, 420, and 430, an insulating film which serves as a base film may be provided between the substrate and the gate electrode layer. The base film has a function of preventing diffusion of impurity elements from the substrate and can be formed to have a single-layer structure or a stacked-layer structure using a silicon nitride film, a silicon oxide film, a silicon nitride oxide film, and/or a silicon oxynitride film.

The gate electrode layer 401 can be formed to have a single-layer structure or a stacked-layer structure using a metal material such as molybdenum, titanium, chromium, tantalum, tungsten, aluminum, copper, neodymium, or scandium, or an alloy material which contains any of these materials as a main component.

The gate insulating layer 402 can be formed to have a single-layer structure or a stacked-layer structure using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and/or a hafnium oxide layer by a plasma CVD method, a sputtering method, or the like. For example, as illustrated in FIG. 6A, a silicon nitride layer ($SiN_y(y>0)$) with a thickness of greater than or equal to 50 nm and less than or equal to 200 nm is formed as a first gate insulating layer by a plasma CVD method, and then a silicon oxide layer ($SiO_x(x>0)$) with a thickness of greater than or equal to 5 nm and less than or equal to 300 nm is stacked as a second gate insulating layer over the first gate insulating layer, so that a gate insulating layer is formed.

For a conductive film used for the source electrode layer 405a and the drain electrode layer 405b, for example, an element selected from Al, Cr, Cu, Ta, Ti, Mo, and W, an alloy containing any of these elements as a component, an alloy film in which any of these elements are combined, or the like can be used. The conductive film may have a structure in which a high-melting-point metal layer of Ti, Mo, W, or the like is stacked over and/or below a metal layer of Al, Cu, or the like. When an Al material to which an element (e.g., Si, Nd, or Sc) which prevents generation of hillocks and whiskers in an Al film is added is used, heat resistance can be increased.

A material similar to that for the source electrode layer 405a and the drain electrode layer 405b can be used for a conductive film used for the wiring layer 436a and the wiring layer 436b which are respectively connected to the source electrode layer 405a and the drain electrode layer 405b.

Alternatively, the conductive film which serves as the source electrode layer 405a and the drain electrode layer 405b (including a wiring layer formed using the same layer as the source electrode layer 405a and the drain electrode layer 405b) may be formed using a conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon or silicon oxide is contained can be used.

As the insulating layers 407, 427, and 437, an inorganic insulating film, typical examples of which are a silicon oxide film, a silicon oxynitride film, an aluminum oxide film, and an aluminum oxynitride film, can be used.

As the protective insulating layer 409, an inorganic insulating film such as a silicon nitride film, an aluminum nitride film, a silicon nitride oxide film, or an aluminum nitride oxide film can be used.

Further, a planarization insulating film may be formed over the protective insulating layer 409 so that surface roughness due to the transistor is reduced. For the planarization insulating film, an organic material such as polyimide, acrylic, or benzocyclobutene can be used. Other than such organic materials, it is also possible to use a low-dielectric constant material (a low-k material) or the like. Note that the planarization insulating film may be formed by stacking a plurality of insulating films formed using these materials.

In each of the transistors 410, 420, 430, and 440 including the oxide semiconductor layer 403, current in an off state (i.e., off-state current) is low. Accordingly, when the transistor is in an off state, the leakage of electric charge through the transistor can be controlled. Thus, the transistor is used as a transistor provided in each pixel, whereby the input frequency of image signals to the pixel can be reduced. In other words, even in the case where a period in which an image signal is not input to the pixel is lengthened, the period can be maintained without deterioration of display quality in the pixel, which results in a reduction in power consumption of the display device described in Embodiment 1. The reason for the above is as follows: the transistor in this embodiment is used as a transistor provided in each pixel, whereby the frame frequency of an extracted image signal can be reduced.

In addition, each of the transistors 410, 420, 430, and 440 including the oxide semiconductor layer 403 can have relatively high field-effect mobility and thus can operate at a high speed. Thus, the transistor in this embodiment is used as a transistor included in each pixel of a display device, whereby high-definition images can be provided.

Note that the driver circuit and the relay circuits in the display device described in Embodiment 1 can also be formed using any of the transistors 410, 420, 430, and 440 each including the oxide semiconductor layer 403. The expansion of the application range of the transistors makes it possible to reduce the manufacturing cost of the display device.

Note that this embodiment or part of this embodiment can be freely combined with the other embodiments or part of the other embodiments.

Embodiment 3

In this embodiment, an example of the transistor described in Embodiment 2 will be described with reference to FIGS. 7A to 7E.

FIGS. 7A to 7E illustrate an example of a cross-sectional structure of a transistor. A transistor 510 illustrated in FIGS. 7A to 7E is an inverted staggered transistor having a bottom-gate structure, which is similar to the transistor 410 illustrated in FIG. 6A.

An oxide semiconductor used for a semiconductor layer in this embodiment is made to be an i-type (intrinsic) oxide semiconductor or made to be extremely close to an i-type (intrinsic) oxide semiconductor by being purified by removing hydrogen, which is an n-type impurity, from an oxide semiconductor so that impurities that are not main components of the oxide semiconductor are contained as little as possible. In other words, the oxide semiconductor in this embodiment has a feature in that it is made to be an i-type (intrinsic) semiconductor or made to be close thereto not by addition of impurities but by being purified by removing impurities such as hydrogen or water as much as possible. Therefore, the oxide semiconductor layer included in the transistor 510 is an oxide semiconductor layer which is a purified and electrically i-type (intrinsic) oxide semiconductor layer.

In addition, a purified oxide semiconductor includes extremely few (close to zero) carriers, and the carrier concentration thereof is lower than $1\times10^{14}/cm^3$, preferably lower than $1\times10^{12}/cm^3$, more preferably lower than $1\times10^{11}/cm^3$.

Since the oxide semiconductor includes extremely few carriers, the off-state current of the transistor can be reduced. It is preferable that the off-state current be as low as possible.

Specifically, in a transistor including the above-described oxide semiconductor layer, the off-state current density per channel width of 1 μm at room temperature can be reduced to less than or equal to 10 aA/μm ($1\times10^{-17}$ A/μm), further to less than or equal to 1 aA/μm ($1\times10^{-18}$ A/μm), still further to less than or equal to 10 zA/μm ($1\times10^{-20}$ A/μm).

The on-state current of the transistor 510 including the above-described oxide semiconductor layer hardly depends on temperature and the off-state current remains very low.

A process for manufacturing the transistor 510 over a substrate 505 will be described below with reference to FIGS. 7A to 7E.

First, a conductive film is formed over the substrate 505 having an insulating surface, and then a gate electrode layer 511 is formed in a first photolithography step. Note that a resist mask may be formed by an ink-jet method. Formation of the resist mask by an ink-jet method needs no photomask; thus, the manufacturing cost can be reduced.

As the substrate 505 having an insulating surface, a substrate similar to that used as the substrate 400 described in Embodiment 2 can be used. In this embodiment, a glass substrate is used as the substrate 505.

An insulating film which serves as a base film may be provided between the substrate 505 and the gate electrode layer 511. The base film has a function of preventing diffusion of impurity elements from the substrate 505 and can be formed to have a single-layer structure or a stacked-layer structure using a silicon nitride film, a silicon oxide film, a silicon nitride oxide film, and/or a silicon oxynitride film.

The gate electrode layer 511 can be formed to have a single-layer structure or stacked-layer structure using a metal material such as molybdenum, titanium, tantalum, tungsten, aluminum, copper, neodymium, or scandium, or an alloy which contains any of these materials as a main component.

Next, a gate insulating layer 507 is formed over the gate electrode layer 511. The gate insulating layer 507 can be formed to have a single-layer structure or a stacked-layer structure using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer and/or a hafnium oxide layer by a plasma CVD method, a sputtering method, or the like.

As the oxide semiconductor in this embodiment, an oxide semiconductor which is made to be i-type or substantially i-type by removing impurities is used. Such a purified oxide semiconductor is highly sensitive to an interface state and interface charge; thus, an interface between the oxide semiconductor layer and the gate insulating layer is important. For that reason, the gate insulating layer that is to be in contact with the purified oxide semiconductor needs to have high quality.

For example, high-density plasma CVD using a microwave (e.g., a frequency of 2.45 GHz) is preferably used, in which case an insulating layer which is dense, has high withstand voltage, and has high quality can be formed. The purified oxide semiconductor and the high-quality gate insulating layer are in close contact with each other, whereby the interface state can be reduced and favorable interface characteristics can be obtained.

Needless to say, another film formation method such as a sputtering method or a plasma CVD method can be employed as long as the method enables formation of a good-quality insulating layer as a gate insulating layer. Further, an insulating layer whose film quality and characteristic of the interface with an oxide semiconductor are improved by heat treatment performed after formation of the insulating layer may be formed as a gate insulating layer. In any case, any insulating layer may be used as long as the insulating layer has characteristics of enabling a reduction in interface state density of the interface between the insulating layer and an oxide semiconductor and formation of a favorable interface as well as having good film quality as a gate insulating layer.

Further, in order that hydrogen, hydroxyl group, and moisture are contained as little as possible in the gate insulating layer 507 and an oxide semiconductor film 530, it is preferable that the substrate 505 over which the gate electrode layer 511 is formed or the substrate 505 over which the gate electrode layer 511 and the gate insulating layer 507 are formed be preheated in a preheating chamber of a sputtering apparatus as pretreatment for the formation of the oxide semiconductor film 530 to eliminate and remove impurities such as hydrogen and moisture adsorbed on the substrate 505. As an evacuation unit provided for the preheating chamber, a cryopump is preferably used. Note that this preheating treatment can be omitted. Further, this preheating treatment may be performed in a similar manner on the substrate 505 over which layers up to and including a source electrode layer 515a and a drain electrode layer 515b are formed before formation of an insulating layer 516.

Figure 7A:
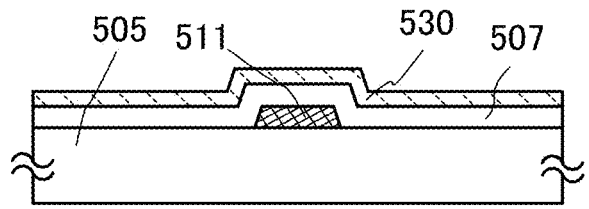
FIGS. 7A to 7E are views illustrating a transistor according to Embodiment 3.
Figure 7B:
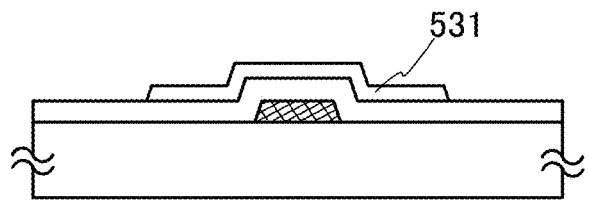
Figure 7C:
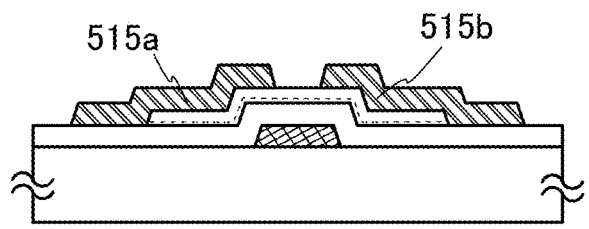

Next, over the gate insulating layer 507, the oxide semiconductor film 530 with a thickness of greater than or equal to 2 nm and less than or equal to 200 nm, preferably greater than or equal to 5 nm and less than or equal to 30 nm is formed (see FIG. 7A).

Note that before the oxide semiconductor film 530 is formed by a sputtering method, powdery substances (also referred to as particles or dust) attached to a surface of the gate insulating layer 507 are preferably removed by reverse sputtering in which plasma is generated by introduction of an argon gas. The reverse sputtering refers to a method in which, without application of voltage to a target side, an RF power source is used for application of voltage to a substrate side in an argon atmosphere to generate plasma in the vicinity of the substrate to modify a surface. Note that a nitrogen atmosphere, a helium atmosphere, an oxygen atmosphere, or the like may be used instead of an argon atmosphere.

As an oxide semiconductor used for the oxide semiconductor film 530, any of the oxide semiconductors such as the four-component metal oxide, the three-component metal oxide, the two-component metal oxide, the In—O-based oxide semiconductor, the Sn—O-based oxide semiconductor, and the Zn—O-based oxide semiconductor which are given in Embodiment 2 can be used. Further, $SiO_2$ may be contained in the above oxide semiconductor. In this embodiment, the oxide semiconductor film 530 is formed with the use of an In—Ga—Zn—O-based metal oxide target by a sputtering method. FIG. 7A is a cross-sectional view at this stage. The oxide semiconductor film 530 can be formed by a sputtering method in a rare gas (typically argon) atmosphere, an oxygen atmosphere, or a mixed atmosphere of a rare gas and oxygen.

As a target for forming the oxide semiconductor film 530 by a sputtering method, for example, a target having a composition ratio of $In_2O_3$ to $Ga_2O_3$ and ZnO of 1:1:1 [mol] (i.e., In:Ga:Zn=1:1:0.5 [atom]) can be used. Alternatively, a metal oxide target having a composition ratio of In to Ga and Zn of 1:1:1 [atom] or a composition ratio of In to Ga and Zn of 1:1:2 [atom] may be used. The filling factor of the metal oxide target is greater than or equal to 90% and less than or equal to 100%, preferably greater than or equal to 95% and less than or equal to 99.9%. With the use of a metal oxide target with a high filling factor, a dense oxide semiconductor film is formed.

It is preferable that a high-purity gas from which impurities such as hydrogen, water, hydroxyl group, or hydride have been removed be used as a sputtering gas used for the formation of the oxide semiconductor film 530.

The substrate is held in a deposition chamber kept under reduced pressure, and the substrate temperature is set to temperatures higher than or equal to 100° C. and lower than or equal to 600° C., preferably higher than or equal to 200° C. and lower than or equal to 400° C. By forming the oxide semiconductor film with the substrate heated, the concentration of impurities in the formed oxide semiconductor film can be reduced. In addition, damage due to sputtering can be reduced. Then, a sputtering gas from which hydrogen and moisture have been removed is introduced into the deposition chamber while moisture remaining therein is removed, and the oxide semiconductor film 530 is formed over the substrate 505 with the use of the above target. In order to remove moisture remaining in the deposition chamber, an entrapment vacuum pump such as a cryopump, an ion pump, or a titanium sublimation pump is preferably used. The evacuation unit may be a turbo pump provided with a cold trap. In the deposition chamber which is evacuated with a cryopump, a hydrogen atom, a compound containing a hydrogen atom, such as water ($H_2O$), (more preferably, also a compound containing a carbon atom), and the like are removed, whereby the concentration of impurities in the oxide semiconductor film formed in the deposition chamber can be reduced.

As an example of the deposition condition, the following conditions are employed: the distance between the substrate and the target is 100 mm, the pressure is 0.6 Pa, the direct-current (DC) power is 0.5 kW, and the atmosphere is an oxygen (the proportion of oxygen flow: 100%) atmosphere. Note that a pulsed direct-current power source is preferably used, in which case powder substances (also referred to as particles or dust) that are generated in deposition can be reduced and the film thickness can be uniform.

Next, the oxide semiconductor film 530 is processed into an island-shaped oxide semiconductor layer in a second photolithography step. A resist mask for forming the island-shaped oxide semiconductor layer may be formed by an ink-jet method. Formation of the resist mask by an ink-jet method needs no photomask; thus, the manufacturing cost can be reduced.

In the case where a contact hole is formed in the gate insulating layer 507, a step of forming the contact hole can be performed at the same time as processing of the oxide semiconductor film 530.

Note that etching of the oxide semiconductor film 530 may be dry etching, wet etching, or both dry etching and wet etching. As an etchant used for wet etching for the oxide semiconductor film 530, for example, a mixed solution of phosphoric acid, acetic acid, and nitric acid, or the like can be used. Alternatively, ITO07N (produced by KANTO CHEMICAL CO., INC.) may be used.

Next, first heat treatment is performed on the oxide semiconductor layer. The oxide semiconductor layer can be dehydrated or dehydrogenated by this first heat treatment. The temperature of the first heat treatment is higher than or equal to 400° C. and lower than or equal to 750° C., preferably higher than or equal to 400° C. and lower than the strain point of the substrate. In this embodiment, the substrate is put in an electric furnace which is a kind of heat treatment apparatus and heat treatment is performed on the oxide semiconductor layer at 450° C. for one hour in a nitrogen atmosphere, and then water or hydrogen is prevented from entering the oxide semiconductor layer with the oxide semiconductor layer not exposed to air; thus, an oxide semiconductor layer 531 is obtained (see FIG. 7B).

Note that a heat treatment apparatus is not limited to an electric furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the first heat treatment, GRTA in which the substrate is moved into an inert gas heated to temperatures as high as 650° C. to 700° C., heated for several minutes, and moved out of the inert gas heated to the high temperature may be performed.

Note that in the first heat treatment, it is preferable that water, hydrogen, and the like be not contained in the atmosphere of nitrogen or a rare gas such as helium, neon, or argon. It is preferable that the purity of nitrogen or a rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

After the oxide semiconductor layer is heated in the first heat treatment, a high-purity oxygen gas, a high-purity $N_2O$ gas, or ultra-dry air (having a dew point lower than or equal to −40° C., preferably lower than or equal to −60° C.) may be introduced into the furnace. It is preferable that the oxygen gas or the $N_2O$ gas do not contain water, hydrogen, and the like. Alternatively, the oxygen gas or the $N_2O$ gas, which is introduced into the heat treatment apparatus, has purity of 6N or higher, preferably purity of 7N or higher (that is, the concentration of impurities in the oxygen gas or the $N_2O$ gas is 1 ppm or lower, preferably 0.1 ppm or lower). Oxygen which is a main component of an oxide semiconductor and has been reduced because of the step of removing impurities through the dehydration or the dehydrogenation is supplied with the use of an effect of an oxygen gas or an $N_2O$ gas, whereby the purity of the oxide semiconductor layer is increased and the oxide semiconductor layer is made to be electrically i-type (intrinsic).

In addition, the first heat treatment for the oxide semiconductor layer can also be performed on the oxide semiconductor film 530 which has not been processed into the island-shaped oxide semiconductor layer. In that case, the substrate is taken out of the heating apparatus after the first heat treatment, and then a photolithography step is performed.

Note that the first heat treatment may be performed at either of the following timings without limitation to the above-described timing as long as it is performed after the oxide semiconductor layer is formed: after a source electrode layer and a drain electrode layer are formed over the oxide semiconductor layer; and after an insulating layer is formed over the source electrode layer and the drain electrode layer.

In the case where a contact hole is formed in the gate insulating layer 507, the formation of the contact hole may be performed before or after the first heat treatment is performed on the oxide semiconductor film 530.

The oxide semiconductor layer is formed through two deposition steps and two heat treatment steps, whereby a thick crystalline region, that is, a crystalline region the c-axis of which is aligned in a direction perpendicular to a surface of the film may be formed even when any of an oxide, a nitride, a metal, and the like is used as a material for a base component. For example, a first oxide semiconductor film with a thickness of greater than or equal to 3 nm and less than or equal to 15 nm is formed and then first heat treatment is performed at temperatures higher than or equal to 450° C. and lower than or equal to 850° C., preferably higher than or equal to 550° C. and lower than or equal to 750° C. in an atmosphere of nitrogen, oxygen, a rare gas, or dry air, whereby a first oxide semiconductor film which includes a crystalline region (including plate-like crystals) in a region including its surface is formed. Then, a second oxide semiconductor film which is thicker than the first oxide semiconductor film is formed and then second heat treatment is performed at temperatures higher than or equal to 450° C. and lower than or equal to 850° C., preferably higher than or equal to 600° C. and lower than or equal to 700° C., so that crystal growth proceeds upward with the use of the first oxide semiconductor film as a seed of the crystal growth, whereby the whole second oxide semiconductor film is crystallized. In such a manner, an oxide semiconductor layer which includes a thick crystalline region may be formed.

Next, a conductive film which serves as a source electrode layer and a drain electrode layer (including a wiring formed using the same layer as the source electrode layer and the drain electrode layer) is formed over the gate insulating layer 507 and the oxide semiconductor layer 531. As the conductive film used for the source electrode layer and the drain electrode layer, the material used for the source electrode layer 405a and the drain electrode layer 405b described in Embodiment 2 can be used. In a third photolithography step, a resist mask is formed over the conductive film and the conductive film is selectively etched, so that a source electrode layer 515a and a drain electrode layer 515b are formed, and then the resist mask is removed (see FIG. 7C).

Light exposure at the time of the formation of the resist mask in the third photolithography step may be performed with the use of ultraviolet light, KrF laser light, or ArF laser light. A channel length L of a transistor that is completed later is determined by a distance between bottom ends of the source electrode layer and the drain electrode layer, which are adjacent to each other over the oxide semiconductor layer 531. In the case where light exposure is performed for a channel length L of less than 25 nm, the light exposure at the time of the formation of the resist mask in the third photolithography step is preferably performed using extreme ultraviolet light having an extremely short wavelength of several nanometers to several tens of nanometers. In the light exposure with extreme ultraviolet light, the resolution is high and the focus depth is large. Therefore, the channel length L of the transistor that is completed later can be greater than or equal to 10 nm and less than or equal to 1000 nm, the operation speed of a circuit can be increased, and power consumption can be reduced because off-state current is extremely low. In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by being etched; thus, the resist mask can be used in a plurality of etching steps for forming different patterns. Therefore, a resist mask corresponding to at least two kinds of different patterns can be formed by one multi-tone mask. Thus, the number of light-exposure masks can be reduced and the number of corresponding photolithography steps can also be reduced, which results in simplification of a process.

Note that it is preferable that etching conditions be optimized in order to prevent the oxide semiconductor layer 531 from being etched and divided at the time of etching of the conductive film. However, it is difficult to obtain conditions under which only the conductive film is etched and the oxide semiconductor layer 531 is not etched at all. Therefore, in some cases, only part of the oxide semiconductor layer 531 is etched to be an oxide semiconductor layer having a groove (a depressed portion) at the time of etching of the conductive film.

Since a Ti film is used as the conductive film and the In—Ga—Zn—O-based oxide semiconductor is used for the oxide semiconductor layer 531 in this embodiment, an ammonium hydrogen peroxide mixture (a mixed solution of ammonia, water, and a hydrogen peroxide solution) is used as an etchant.

Next, plasma treatment may be performed using a gas such as $N_2O$, $N_2$, or Ar so that water adsorbed on a surface of an exposed portion of the oxide semiconductor layer is removed. In the case where the plasma treatment is performed, the insulating layer 516 which serves as a protective insulating film in contact with part of the oxide semiconductor layer is formed without being exposed to air.

The insulating layer 516 can be formed to a thickness of at least 1 nm by a method in which impurities such as water and hydrogen do not enter the insulating layer 516, such as a sputtering method. When hydrogen is contained in the insulating layer 516, entry of the hydrogen to the oxide semiconductor layer or extraction of oxygen in the oxide semiconductor layer by the hydrogen is caused, thereby causing the backchannel of the oxide semiconductor layer to have lower resistance (to have n-type conductivity), so that a parasitic channel might be formed. Therefore, it is important that a formation method in which hydrogen is not used be employed so that the insulating layer 516 contains hydrogen as little as possible.

In this embodiment, as the insulating layer 516, a silicon oxide film is formed to a thickness of 200 nm by a sputtering method. The substrate temperature at the time of film formation may be higher than or equal to room temperature and lower than or equal to 300° C. and is 100° C. in this embodiment. The silicon oxide film can be formed by a sputtering method in a rare gas (typically, argon) atmosphere, an oxygen atmosphere, or a mixed atmosphere of a rare gas and oxygen. As a target, a silicon oxide target or a silicon target can be used. For example, the silicon oxide film can be formed with the use of a silicon target by a sputtering method in an atmosphere containing oxygen. As the insulating layer 516 which is formed in contact with the oxide semiconductor layer, an inorganic insulating film which does not contain impurities such as moisture, a hydrogen ion, and OW and blocks the entry of these impurities from the outside is used. Typically, a silicon oxide film, a silicon oxynitride film, an aluminum oxide film, an aluminum oxynitride film, or the like is used.

As in the case of forming the oxide semiconductor film 530, an entrapment vacuum pump (e.g., a cryopump) is preferably used in order to remove moisture remaining in a deposition chamber used for forming the insulating layer 516. The insulating layer 516 is formed in a deposition chamber in which evacuation has been performed with a cryopump, whereby the concentration of impurities in the insulating layer 516 can be reduced. A turbo pump provided with a cold trap may be used as an evacuation unit for removing moisture remaining in the deposition chamber used for forming the insulating layer 516.

It is preferable that a high-purity gas from which impurities such as hydrogen, water, hydroxyl group, or hydride have been removed be used as a sputtering gas for the formation of the insulating layer 516.

Next, second heat treatment is performed in an inert gas atmosphere or an oxygen gas atmosphere (preferably at temperatures higher than or equal to 200° C. and lower than or equal to 400° C., e.g., higher than or equal to 250° C. and lower than or equal to 350° C.). For example, the second heat treatment is performed at 250° C. in a nitrogen atmosphere for one hour. In the second heat treatment, heat is applied while part of the oxide semiconductor layer (a channel formation region) is in contact with the insulating layer 516.

As described above, the first heat treatment is performed on the oxide semiconductor film, whereby impurities such as hydrogen, moisture, hydroxyl group, or hydride (also referred to as a hydrogen compound) can be intentionally eliminated from the oxide semiconductor layer and oxygen, which is one of main components of the oxide semiconductor but has been reduced through the step of eliminating the impurities, can be supplied. Thus, the purity of the oxide semiconductor layer is increased and the oxide semiconductor layer is made to be electrically i-type (intrinsic).

Figure 7D:
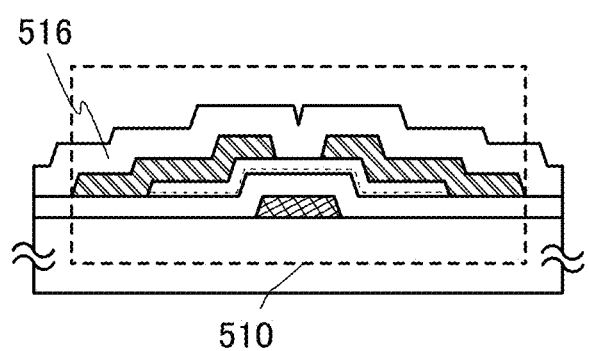
Figure 7E:
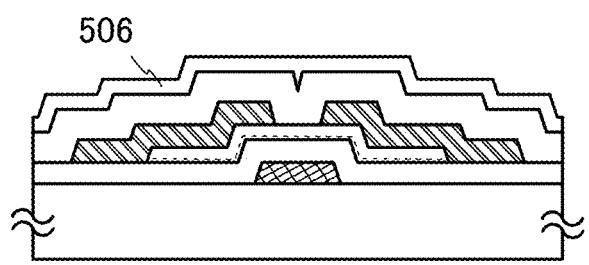

Through the above-described process, the transistor 510 is manufactured (FIG. 7D).

When a silicon oxide layer having a lot of defects is used as the insulating layer, impurities such as hydrogen, moisture, hydroxyl group, or hydride contained in the oxide semiconductor layer are diffused to the insulating layer by heat treatment after the formation of the silicon oxide layer, so that the impurities in the oxide semiconductor layer can be further reduced.

A protective insulating layer 506 may be additionally formed over the insulating layer 516. For example, a silicon nitride film is formed by an RF sputtering method. Since an RF sputtering method allows an increase in productivity, it is preferably used as a formation method of the protective insulating layer. As the protective insulating layer, an inorganic insulating film which does not contain impurities such as moisture and blocks the entry of the impurities from the outside is used; for example, a silicon nitride film, an aluminum nitride film, or the like is used. In this embodiment, as the protective insulating layer, the protective insulating layer 506 is formed of a silicon nitride film (see FIG. 7E).

In this embodiment, as the protective insulating layer 506, a silicon nitride film is formed by heating the substrate 505 over which layers up to and including the insulating layer 516 are formed to temperatures in the range of 100° C. to 400° C.; introducing a sputtering gas containing high-purity nitrogen from which hydrogen and moisture have been removed; and using a silicon target. In this step also, it is preferable that the protective insulating layer 506 be formed while moisture remaining in the deposition chamber is removed as in the case of the formation of the insulating layer 516.

After the formation of the protective insulating layer, heat treatment may be further performed at temperatures higher than or equal to 100° C. and lower than or equal to 200° C. in air for greater than or equal to 1 hour and less than or equal to 30 hours. This heat treatment may be performed at a fixed heating temperature. Alternatively, the following change in the heating temperature may be conducted plural times repeatedly: the heating temperature is increased from room temperature to temperatures in the range of 100° C. to 200° C. and then decreased to room temperature.

As described above, the transistor including the purified oxide semiconductor layer, which is manufactured in accordance with this embodiment, is used, whereby current in an off state (i.e., off-state current) can be further reduced. Accordingly, when the transistor is in an off state, the leakage of electric charge through the transistor can be controlled. Thus, the transistor is used as a transistor provided in each pixel, whereby the input frequency of image signals to the pixel can be reduced. In other words, even in the case where a period in which an image signal is not input to the pixel is increased, the period can be maintained without deterioration of display quality in the pixel, which results in a reduction in power consumption of the display device described in Embodiment 1. The reason for the above is as follows: the transistor in this embodiment is used as a transistor provided in each pixel, whereby the frame frequency of an extracted image signal can be reduced.

In addition, a transistor including a purified oxide semiconductor layer can have relatively high field-effect mobility and thus can operate at a high speed. Thus, the transistor in this embodiment is used as a transistor included in each pixel of a display device, whereby high-definition images can be provided.

Note that the driver circuit and the relay circuits in the display device described in Embodiment 1 can also be formed using the transistor including the purified oxide semiconductor layer. The expansion of the application range of the transistor makes it possible to reduce the manufacturing cost of the display device.

Note that this embodiment or part of this embodiment can be freely combined with the other embodiments or part of the other embodiments.

Embodiment 4

In this embodiment, a structure of the display device described in the above embodiments, which has a touch panel function, will be described with reference to FIGS. 8A and 8B.

Figure 8A:
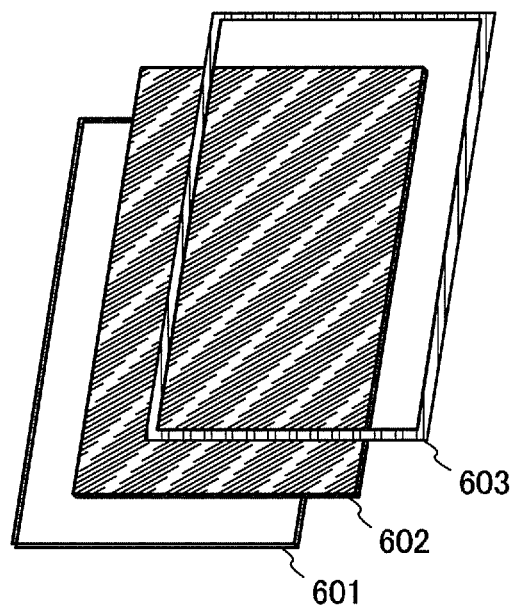
FIGS. 8A and 8B are views each illustrating a display device according to Embodiment 4.

FIG. 8A is a schematic view of a display device in this embodiment. FIG. 8A illustrates a structure in which a touchpad 602 stacked on a liquid crystal display panel 601 which is the display device described in Embodiment 1 and they are attached to each other in a housing 603. The touchpad 602 can be of resistive type, surface capacitive type, projected capacitive type, or the like as appropriate. Note that in the display device illustrated in FIG. 8A, the touchpad 602 corresponds to the input device in the display device described in Embodiment 1.

The display panel 601 and the touchpad 602 are separately manufactured and then stacked together as illustrated in FIG. 8A, whereby the manufacturing cost of a display device having a touch panel function can be reduced.

Figure 8B:
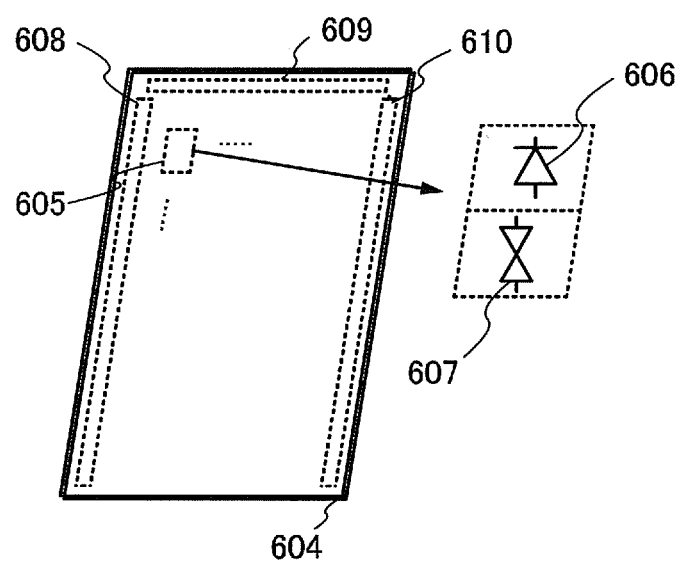

FIG. 8B illustrates a structure of a display device having a touch panel function, which is different from that illustrated in FIG. 8A. A display device 604 illustrated in FIG. 8B includes a photosensor 606 and a liquid crystal element 607 in each of a plurality of pixels 605. Therefore, unlike the display device illustrated in FIG. 8A, the touchpad 602 does not need to be stacked to manufacture the display device, so that the display device can be thin. Note that a scan line driver circuit 608, a signal line driver circuit 609, and a photosensor driver circuit 610 and the pixels 605 are manufactured over one substrate, so that the size of the display device can be reduced. Note that the photosensor 606 may be formed using amorphous silicon or the like and may overlap with a transistor including an oxide semiconductor.

Note that this embodiment or part of this embodiment can be freely combined with the other embodiments or part of the other embodiments.

Embodiment 5

In this embodiment, examples of electronic devices on each of which the display device obtained in accordance with Embodiment 1 is mounted will be described with reference to FIGS. 9A to 9D.

Figure 9A:
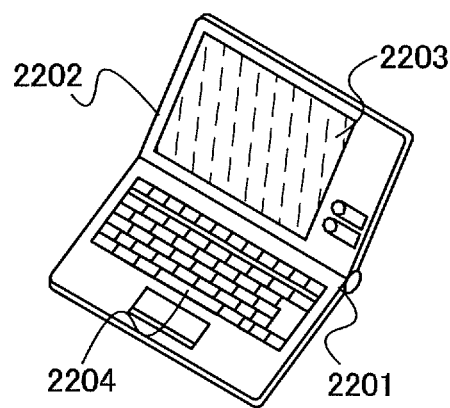
FIGS. 9A to 9D are diagrams illustrating electronic devices according to Embodiment 5.

FIG. 9A illustrates a laptop personal computer, which includes a main body 2201, a housing 2202, a display portion 2203, a keyboard 2204, and the like.

Figure 9B:
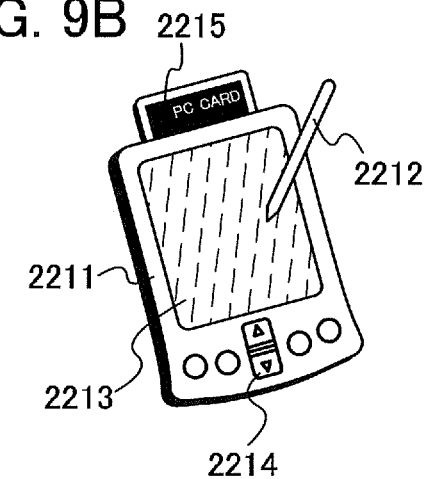

FIG. 9B illustrates a portable information terminal (PDA), which includes a main body 2211 provided with a display portion 2213, an external interface 2215, operation buttons 2214, and the like. A stylus 2212 is included as an accessory for operation.

Figure 9C:
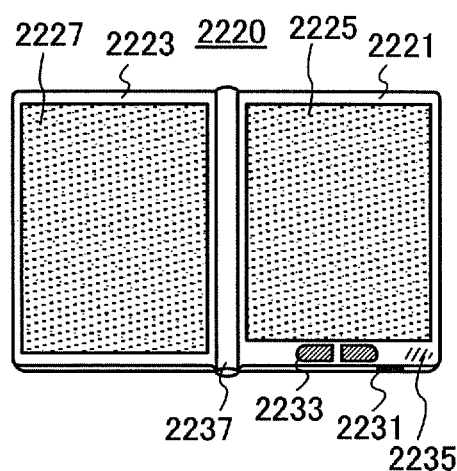

FIG. 9C illustrates an e-book reader 2220 as an example of an electronic device equipped with an electronic paper. The e-book reader 2220 includes two housings: a housing 2221 and a housing 2223. The housings 2221 and 2223 are bound with each other by an axis portion 2237, along which the e-book reader 2220 can be opened and closed. Such a structure enables the e-book reader 2220 to be treated like a paper book.

A display portion 2225 is incorporated in the housing 2221, and a display portion 2227 is incorporated in the housing 2223. The display portion 2225 and the display portion 2227 may display one image or different images. In the structure where the display portions display different images, for example, the right display portion (the display portion 2225 in FIG. 9C) can display text and the left display portion (the display portion 2227 in FIG. 9C) can display images.

Further, in FIG. 9C, the housing 2221 is provided with an operation portion and the like. The housing 2221 is provided with, for example, a power supply 2231, operation keys 2233, a speaker 2235, and the like. With the operation keys 2233, pages can be turned. Note that a keyboard, a pointing device, or the like may also be provided on the surface of the housing, on which the display portion is provided.

Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 2220 may have a function of an electronic dictionary.

The e-book reader 2220 may be configured to transmit and receive data wirelessly. Through wireless communication, desired book data or the like can be purchased and downloaded from an e-book server.

Note that an electronic paper can be applied to devices in a variety of fields as long as they display information. For example, an electronic paper can be used for posters, advertisement in vehicles such as trains, display in a variety of cards such as credit cards, and the like in addition to e-book readers.

Figure 9D:
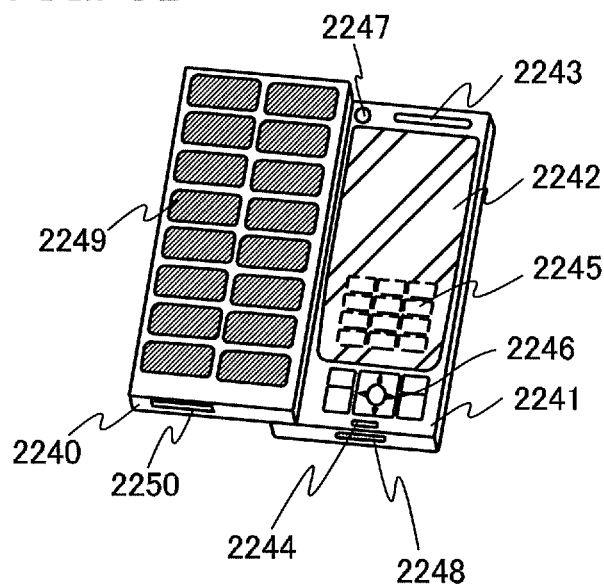

FIG. 9D illustrates a mobile phone. The mobile phone includes two housings: a housing 2240 and a housing 2241. The housing 2241 is provided with a display panel 2242, a speaker 2243, a microphone 2244, a pointing device 2246, a camera lens 2247, an external connection terminal 2248, and the like. The housing 2240 is provided with a solar cell 2249 which charges the mobile phone, an external memory slot 2250, and the like. An antenna is incorporated in the housing 2241.

The display panel 2242 has a touch panel function. A plurality of operation keys 2245 which is displayed as images is illustrated by dashed lines in FIG. 9D. Note that the mobile phone includes a booster circuit for increasing a voltage output from the solar cell 2249 to a voltage needed for each circuit. Moreover, the mobile phone can include a contactless IC chip, a small recording device, or the like in addition to the above structure.

The display orientation of the display panel 2242 changes as appropriate in accordance with the usage pattern. Further, the camera lens 2247 is provided on the same surface as the display panel 2242; thus, the mobile phone can be used as a videophone. The speaker 2243 and the microphone 2244 can be used for videophone calls, recording, and playing sound, and the like as well as voice calls. Moreover, the housings 2240 and 2241 in a state where they are developed as illustrated in FIG. 9D can be slid so that one is lapped over the other; therefore, the size of the mobile phone can be reduced, which makes the mobile phone suitable for being carried.

The external connection terminal 2248 can be connected to an AC adapter or a variety of cables such as a USB cable, which enables charging of the mobile phone and data communication. Moreover, a larger amount of data can be saved and moved by inserting a recording medium to the external memory slot 2250. Further, in addition to the above functions, an infrared communication function, a television reception function, or the like may be provided.

This application is based on Japanese Patent Application serial no. 2010-010250 filed with Japan Patent Office on Jan. 20, 2010, the entire contents of which are hereby incorporated by reference.

EXPLANATION OF REFERENCE

10: pixel portion, 11: driver circuit, 12: input device, 13: processor, 14: relay circuit, 15: relay circuit, 16: signal detection circuit, 17: signal generation circuit, 18: signal extraction circuit, 21: signal detection portion, 22: latch portion, 23: memory portion, 24: reset portion, 30: substrate, 400: substrate, 401: gate electrode layer, 402: gate insulating layer, 403: oxide semiconductor layer, 405a: source electrode layer, 405b: drain electrode layer, 407: insulating layer, 409: protective insulating layer, 410: transistor, 420: transistor, 427: insulating layer, 430: transistor, 436a: wiring layer, 436b: wiring layer, 437: insulating layer, 440: transistor, 505: substrate, 506: protective insulating layer, 507: gate insulating layer, 510: transistor, 511: gate electrode layer, 515a: source electrode layer, 515b: drain electrode layer, 516: insulating layer, 530: oxide semiconductor film, 531: oxide semiconductor layer, 601: display panel, 602: touchpad, 603: housing, 604: display device, 605: pixel, 606: photosensor, 607: liquid crystal element, 608: scan line driver circuit, 609: signal line driver circuit, 610: photosensor driver circuit, 2201: main body, 2202: housing, 2203: display portion, 2204: keyboard, 2211: main body, 2212: stylus, 2213: display portion, 2214: operation button, 2215: external interface, 2220: e-book reader, 2221: housing, 2223: housing, 2225: display portion, 2227: display portion, 2231: power supply, 2233: operation key, 2235: speaker, 2237: axis portion, 2240: housing, 2241: housing, 2242: display panel, 2243: speaker, 2244: microphone, 2245: operation key, 2246: pointing device, 2247: camera lens, 2248: external connection terminal, 2249: solar cell, and 2250: external memory slot.

The invention claimed is:

1. A liquid crystal display device comprising:
a pixel portion over a glass substrate;
a first driver circuit over the glass substrate; and
a second driver circuit over the glass substrate,
wherein the pixel portion comprises:
a gate electrode provided over the glass substrate;
a first insulating layer provided over the gate electrode;

a first oxide semiconductor layer provided over the first insulating layer, the first oxide semiconductor layer having a first thickness;
a second oxide semiconductor layer provided over the first oxide semiconductor layer, the second oxide semiconductor layer having a second thickness greater than the first thickness;
a first conductive layer and a second conductive layer provided over and being in electrical contact with the second oxide semiconductor layer;
a second insulating layer provided over the first conductive layer and the second conductive layer, the second insulating layer comprising silicon oxide;
a third insulating layer provided over the second insulating layer, the third insulating layer comprising silicon nitride; and
a fourth insulating layer provided over the third insulating layer, the fourth insulating layer comprising an organic material,
wherein the gate electrode overlaps with the first conductive layer and the second conductive layer,
wherein the first insulating layer comprises a first insulating film comprising silicon nitride and a second insulating film comprising silicon oxide over the first insulating film,
wherein the first conductive layer is in contact with a side surface of the first oxide semiconductor layer and a side surface of the second oxide semiconductor layer, and
wherein the second insulating layer is in contact with a top surface of the second oxide semiconductor layer and a top surface of the first insulating layer.

2. The liquid crystal display device according to claim 1, wherein the gate electrode has a tapered angle.

3. The liquid crystal display device according to claim 1, wherein each of the first oxide semiconductor layer and the second oxide semiconductor layer comprises indium, gallium, and zinc.

4. A liquid crystal display device comprising:
a pixel portion over a glass substrate;
a first driver circuit over the glass substrate; and
a second driver circuit over the glass substrate,
wherein the pixel portion comprises:
  a gate electrode provided over the glass substrate;
  a first insulating layer provided over the gate electrode;
  a first oxide semiconductor layer provided over the first insulating layer, the first oxide semiconductor layer having a first thickness;
  a second oxide semiconductor layer provided over the first oxide semiconductor layer, the second oxide semiconductor layer having a second thickness greater than the first thickness;
  a first conductive layer and a second conductive layer provided over and being in electrical contact with the second oxide semiconductor layer;
  a second insulating layer provided over the first conductive layer and the second conductive layer, the second insulating layer comprising silicon oxide;
  a third insulating layer provided over the second insulating layer, the third insulating layer comprising silicon nitride; and
  a fourth insulating layer provided over the third insulating layer, the fourth insulating layer comprising an organic material,
wherein the gate electrode overlaps with the first conductive layer and the second conductive layer,
wherein the first insulating layer comprises a first insulating film comprising silicon nitride and a second insulating film comprising silicon oxide over the first insulating film,
wherein the first conductive layer is in contact with a side surface of the first oxide semiconductor layer and a side surface of the second oxide semiconductor layer,
wherein the second insulating layer is in contact with a top surface of the second oxide semiconductor layer and a top surface of the first insulating layer, and
wherein the first oxide semiconductor layer comprises a crystalline portion.

5. The liquid crystal display device according to claim 4, wherein each of the first oxide semiconductor layer and the second oxide semiconductor layer comprises indium, gallium, and zinc.

6. The liquid crystal display device according to claim 4, wherein the second oxide semiconductor layer comprises a crystalline portion.

7. The liquid crystal display device according to claim 4, wherein the gate electrode has a tapered angle.

* * * * *